(12) United States Patent
Chien et al.

(10) Patent No.: US 7,155,654 B2
(45) Date of Patent: Dec. 26, 2006

(54) LOW COMPLEXITY ERROR CONCEALMENT FOR WIRELESS TRANSMISSION

(75) Inventors: Charles Chien, Newbury Park, CA (US); David Hsueh-Chia Chien, S. El Monte, CA (US)

(73) Assignee: SST Communications, Corp., Santa Monica, CA (US)

( * ) Notice: Subject to any disclaimer, the term of this patent is extended or adjusted under 35 U.S.C. 154(b) by 588 days.

(21) Appl. No.: 10/435,176

(22) Filed: May 10, 2003

(65) Prior Publication Data

US 2004/0205438 A1 Oct. 14, 2004

Related U.S. Application Data

(60) Provisional application No. 60/460,523, filed on Apr. 4, 2003.

(51) Int. Cl.
*H04L 1/00* (2006.01)
*G06F 11/00* (2006.01)

(52) U.S. Cl. .................................... 714/747; 714/758

(58) Field of Classification Search ................ 714/758, 714/748, 746–747
See application file for complete search history.

(56) References Cited

U.S. PATENT DOCUMENTS

| | | | | |
|---|---|---|---|---|
| 4,398,224 A | * | 8/1983 | Watanabe | .................... 386/91 |
| 4,549,298 A | * | 10/1985 | Creed et al. | ................. 714/758 |
| 4,794,467 A | * | 12/1988 | Okuyama et al. | ............. 360/15 |
| 4,811,123 A | * | 3/1989 | Yoshinaka | .................... 360/26 |
| 5,142,537 A | * | 8/1992 | Kutner et al. | ................ 714/747 |
| 5,396,504 A | * | 3/1995 | Pack | .......................... 714/755 |
| 6,526,008 B1 | * | 2/2003 | Caponetto et al. | ....... 369/44.35 |

OTHER PUBLICATIONS

Charles Chien, Igor Elgorriaga, Charles McConaghy, *Low-Power Direct-Sequence Spread-Spectrum Modern Architecture For Distributed Wireless Sensor Networks*, Association for Computing Machinery, ISLPED '01, Aug. 6-7, 2001, Huntington Beach, California, USA, pp. 251-254.

* cited by examiner

*Primary Examiner*—Guy J. Lamarre
(74) *Attorney, Agent, or Firm*—DLA Piper US LLP

(57) ABSTRACT

An apparatus and method for concealing errors in digital data. An interpolator estimates a value of a sample of digital data from other samples of the digital data. The interpolator has an input for inputting the digital data and an output for outputting the estimated value of the sample of the digital data. A holding unit has an input for selectively receiving the sample of the digital data only when the sample is error free, and an output for outputting the error free sample. The input of the holding unit may be in parallel with the input of the interpolator. A selector selects between outputting the estimated value of the sample of the received digital data from an output of the interpolator and outputting the error free sample of the received digital data from an output of a holding unit based on at least one error indicator.

95 Claims, 17 Drawing Sheets

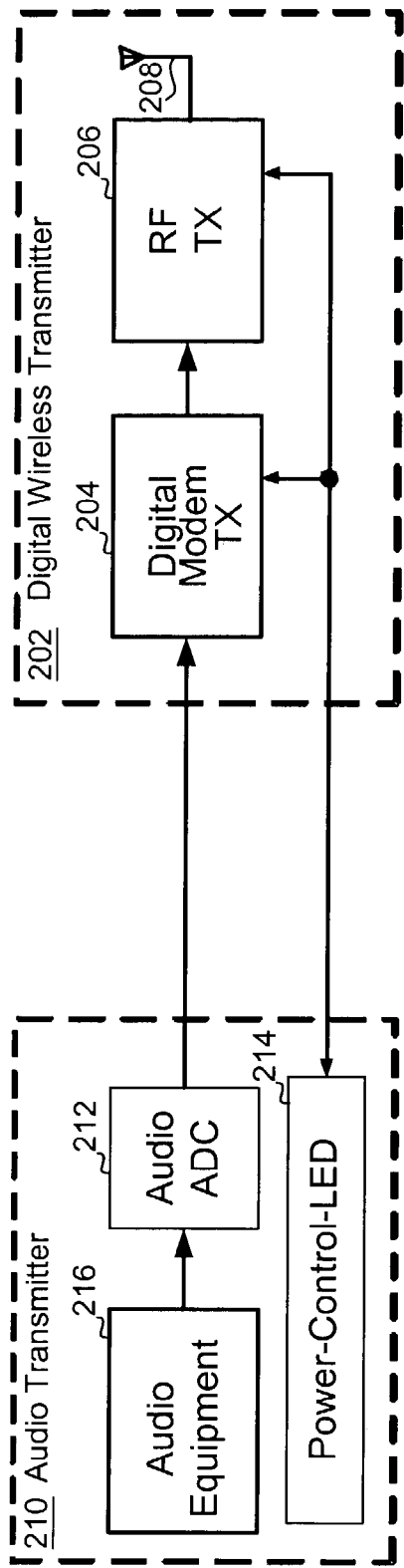
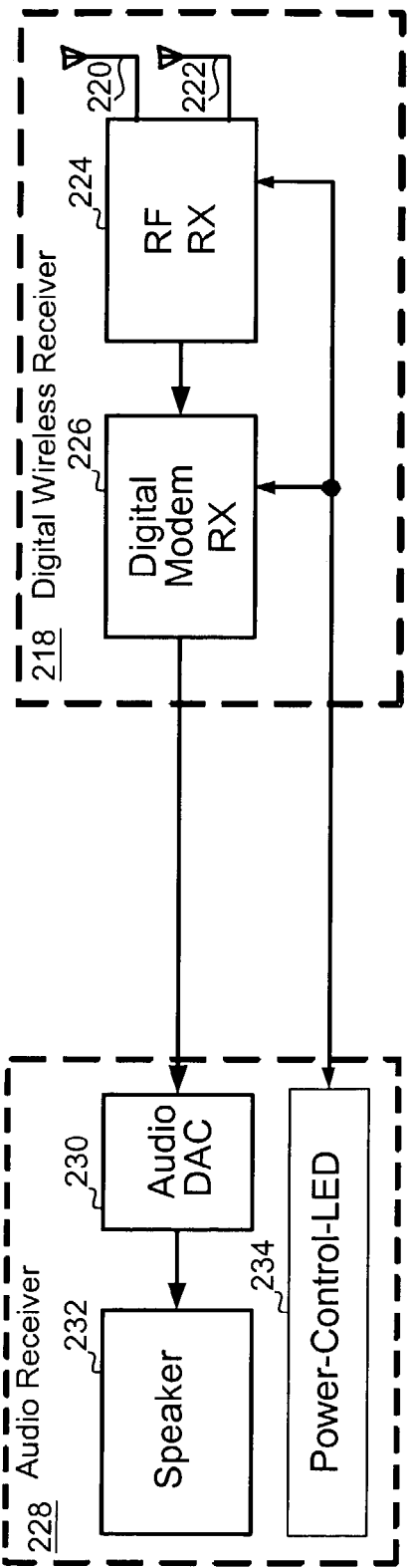
FIG. 2
FIG. 3

LOW COMPLEXITY ERROR CONCEALMENT FOR WIRELESS TRANSMISSION

RELATED APPLICATIONS

This application claims priority to Provisional Application Serial No. 60/460,523, filed Apr. 4, 2003, which is hereby incorporated by reference in its entirety.

BACKGROUND OF THE INVENTION

1. Field of the Invention

The present invention relates generally to the field of digital communications. Specifically, the present invention relates to error concealment in digital communications.

2. Description of the Related Art

Systems for wireless transmission of audio signals are known in the art. FIG. 1 shows a block diagram of a typical structure for such a system 100. The audio equipment 102 is an audio source and may be, for example, a microphone, an FM tuner/receiver, or an analog recording media. The audio signal from the audio equipment 102 is provided to an audio analog to digital converter (ADC) 104 for conversion to digital samples. The digital samples are then provided to digital modem transmitter (TX) 106. Digital modem transmitter 106 may include a formatting unit (not shown) for formatting the digital samples into a specific format. The digital modem transmitter 106 may also include a forward error correction (FEC) coder (not shown) for adding error correction codes to the formatted data and a modulator (not shown) for modulating the formatted data onto a carrier signal. The output of the modulator may be provided to a filter (not shown) and converted to an analog signal using a digital to analog converter (DAC) (not shown) before being sent to the radio frequency (RF) transmitter 108 for transmission via antenna 110.

On the receiver side, the transmitted signal will be received at the RF receiver (RX) 114 via antenna 112. The received signal is then provided to digital modem receiver 116. Digital modem receiver 116 may include ADCs (not shown) for digitizing the received signal and a demodulator (not shown) for recovering the audio data in digital format. Digital modem receiver 116 may further include an FEC decoder (not shown) for recovering the originally transmitted data and a de-formatter (not shown) for de-formatting the demodulated data. Digital modem receiver 116 then provides the demodulated and de-formatted data to audio DAC 118 for conversion to an analog signal that is reproduced by the speaker 120.

A problem involved in the transmission of audio data is that the modulated carrier signal transmitted by the RF transmitter 108 shown in FIG. 1 is subject to corruption of the digitized data during transmission due, for example, to close proximity of other transmission sources. For example, noise may corrupt the signal transmitted by RF transmitter 108 and may result in un-recovered data at the RF receiver 114 due to errors in the data. The result of such a situation may be annoying cracks, pops and the like in the speaker 120.

One method for minimizing such negative effects of corruption of the modulated carrier signal is to provide a level of redundancy for the digitized samples. Such redundancy may be provided by data coding. Data coding consists of adding redundant information to source data in such a way that errors in a received encoded data stream may be identified and corrected. The degree of redundancy that is added determines the number of errors in the received signal that may be corrected, before an uncorrectable level of data interference occurs. Typical coding techniques identify and correct individual bit errors in data streams. As an example of data coding, the FEC coder described above may implement forward error correction codes using well known codes such as convolutional, Bose-Chaudhuri-Hocquenghem (BCH), Reed-Solomon Coding, and the like, in order to eliminate errors of relatively short duration.

Another technique, known as interleaving, may be used. Interleaving processes may be used to separate the digitized samples of the transmitted sequence that would normally be transmitted together. Interleaving processes known in the art reorder the data before transmission such that, for example, any two successive data symbols are separated by a particular number of data symbols in the transmitted sequence. Upon reception, the data symbols are de-interleaved to their original order before the data is recovered. Thus, the interleaving process allows a greater probability that a larger number of errors in the transmitted sequence may be corrected by spreading the errors across the transmitted sequence.

As a result of interleaving a data signal, digitized sample corruption imposed upon this type of interleaved data signal does not affect contiguous bits from the original transmitted sequence, and after de-interleaving, the received coded data will have bit errors that are spread out over time and which may be correctable using the redundant data that was added at the data coding stage. Thus, at the receiver, the group of interleaved digitized samples with the error correction codes are checked, and the group of interleaved digitized samples with errors are corrected.

However, even such sophisticated error codes cannot correct all the bit errors in the digitized samples. In the case where digitized samples are uncorrectable, another technique, known as interpolation, may be used in an attempt to conceal uncorrectable digitized samples. Interpolation processes known in the art estimate a sample value of those uncorrectable digitized samples by interpolating from adjacent digitized samples to conceal any effect of the uncorrectable digitized samples.

However, interpolation may not work well where there are many errors in a transmitted sequence, as there may not be enough good samples from which to interpolate. In other words, interpolation techniques require enough good samples to estimate or predict a sample that is missing as a result of an error. As an example, a first-order interpolator will not be effective when there are sequentially adjacent samples having errors (i.e., two sequentially adjacent bad samples), as linear interpolation works by interpolating the bad sample from two adjacent good samples. Higher-order interpolators may be used to improve the effectiveness of the interpolation process where there are errors in sequentially adjacent samples. However, even higher-order interpolators are limited in their ability to conceal errors under conditions where there are multiple errors.

Any errors in the digitized samples that cannot be corrected or concealed by the techniques discussed above may be muted. However, sudden activation of muting may be distracting and annoying to a user listening to the reproduced audio signal.

Thus, there is a need for a low complexity apparatus, system and method for the concealment of errors such that high perceptual audio quality is achieved.

SUMMARY OF THE DISCLOSURE

Embodiments of the present invention provide for a low complexity apparatus, system and method for the concealment of errors such that high perceptual audio quality is achieved.

According to a first embodiment of the present invention, an apparatus and method for concealing errors in digital data is disclosed. The apparatus has an input for receiving the digital data and an output for outputting the digital data after error concealment. The apparatus comprises at least one interpolator for estimating a value of a sample of the received digital data from other samples of the received digital data. The at least one interpolator has an input for inputting the received digital data and an output for outputting the estimated value of the sample of the received digital data.

The apparatus further comprises at least one holding unit having an input for selectively receiving the sample of the received digital data only when the sample is error free, and an output for outputting an error free sample of the received digital data. The an error free sample may be a previously held error free sample, for example, the most recent sample which was not in error. According to embodiments of the present invention, the at least one holding unit may also accept received digital data that has been at least partially processed by the interpolator. In one embodiment, the input of the at least one holding unit is in parallel with the input of the at least one interpolator.

In addition, the apparatus comprises a selector for selecting between outputting the estimated value of the sample of the received digital data and outputting an error free sample of the received digital data. The error free sample may be a previously held error free sample.

According to further embodiments of the present invention, a receiver for receiving a signal including digital data in the form of packets transmitted from a transmitter, and for concealing errors in the digital data is disclosed. The receiver comprises an interpolator section including at least one interpolator for estimating a value of a sample of received digital data from other samples of the received digital data.

The interpolator section further comprises at least one holding unit having an input for selectively receiving the sample of the received digital data only when the sample is error free. According to embodiments of the present invention, the at least one holding unit may also accept received digital data that has been at least partially processed by the interpolator. In one embodiment, the input of the at least one holding unit is in parallel with the input of the at least one interpolator. The interpolator section further comprises a selector for selecting between outputting the estimated value of the sample of the received digital data and outputting an error free sample of the received digital data. The error free sample may be a previously held error free sample.

According to still further embodiments of the present invention, a communication system is disclosed comprising a transmitter for transmitting digital data and a receiver for receiving the digital data. The receiver has at least one interpolator for estimating a value of a sample of received digital data from other samples of the received digital data and at least one holding unit having an input for selectively receiving the sample of the received digital data only when the sample is error free. According to embodiments of the present invention, the at least one holding unit may also accept received digital data that has been at least partially processed by the interpolator. In one embodiment, the input of the at least one holding unit is in parallel with the input of the at least one interpolator. The receiver further comprises a selector for selecting between outputting the estimated value of the sample of the received digital data and outputting an error free sample of the received digital data based on at least one error indicator. The error free sample may be a previously held error free sample.

According to embodiments of the present invention, the digital data is audio digital data in a standard format such as, but not limited to, I2S (Inter-IC Sound). The audio data is transmitted and received as a packet having at least one audio data block. The at least one error indicator is a result of CRC checks performed on the audio data blocks. The at least one error indicator is used for selectively enabling the at least one holding unit to receive error free samples of the digital data, as well as for selecting between outputting the estimated value of the sample of the received digital data and outputting the error free sample of the received digital data.

According to embodiments of the present invention, the interpolator may be a first through N-order interpolator. In addition, the interpolator may be a multiple order interpolator. When the interpolator is a multiple order interpolator, the order of the interpolator may be selected, for example, based on a signal-to-noise ratio (SNR) and/or an error rate.

These and other features and advantages of embodiments of the invention will be apparent to those skilled in the art from the following detailed description of embodiments of the invention, when read with the drawings and appended claims.

BRIEF DESCRIPTION OF THE DRAWINGS

The present invention is illustrated by way of example, and not by way of limitation, in the figures of the accompanying drawings and in which:

FIGS. 2 and 3 show a block diagram of an exemplary wireless audio chip set, according to embodiments of the present invention;

DETAILED DESCRIPTION OF THE PREFERRED EMBODIMENTS

Figure 1:
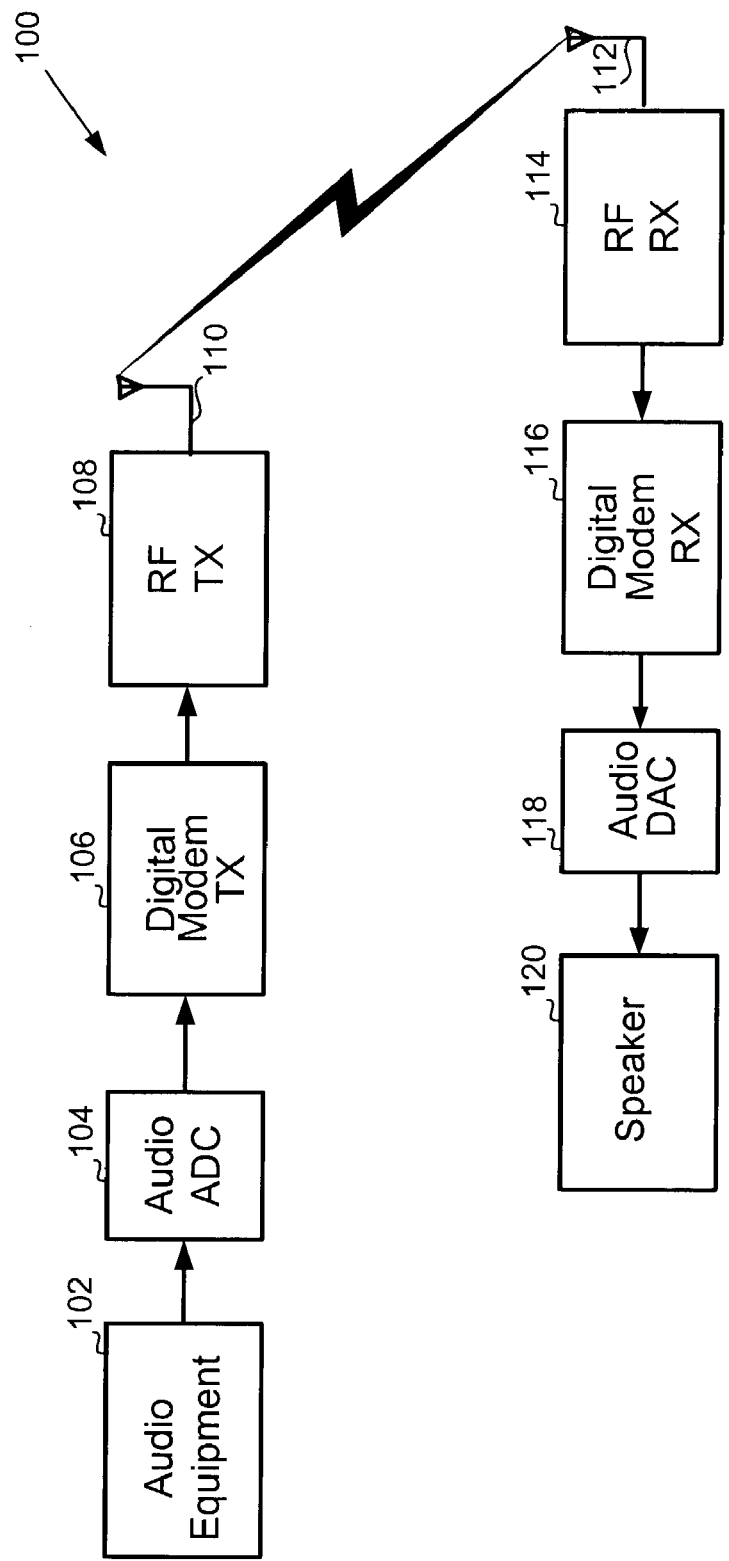
FIG. 1 shows a block diagram of a typical structure of a system for wireless transmission of audio signals.

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of preferred embodiments of the present invention.

The present invention relates generally to the field of digital communications. Specifically, the present invention relates to error concealment of audio signals in digital communications. Embodiments of the present invention may be employed in a variety of communications electronics, including wireless transmission systems as well as wired systems. Thus, embodiments of the invention described herein may be employed in various communications systems, including wireless applications, such as, but not limited to wireless Local Area Networks (LANs), wireless personal communication devices including radios, cellular telephones, mobile cordless telephones, Personal Digital Assistants (PDAs), Personal Computer Memory Card International Association (PCMCIA) computer interface applications, telemetry systems, global positioning systems (GPS) and other RF devices. In these applications, it is typically desirable to implement inexpensive and low-complexity error concealment systems.

As discussed above, conventional error correction and concealment techniques are complex and may not provide satisfactory error correction and/or concealment. Embodiments of the present invention provide a low complexity apparatus and method for the concealment of errors such that high perceptual audio quality is achieved. Embodiments of the apparatus and method do not require sophisticated error correction codes but conceal the error with a low complexity interpolator. Furthermore, embodiments of the apparatus and method do not preclude the use of error correction and interleaving techniques and can therefore further enhance the robustness of systems using existing error correction and interleaving.

Referring to FIGS. 2 and 3, an exemplary wireless audio chip set according to embodiments of the present invention is shown. Digital wireless transmitter 202, shown in FIG. 2 accepts input from the audio ADC block 212 and the power-control-LED block 214 of audio transmitter 210. According to embodiments of the present invention, the audio equipment 216 provides the audio source to the audio ADC block 212, which then provides digital audio data to the digital modem transmitter 204 in a standard format such as, but not limited to, Sony Phillips Digital Interface (SP-DIF) and the I2S. For purposes of illustration, the exemplary wireless audio chip set will be described in relation to the I2S audio format, which consists of LRCK, BCK, and the Data signals.

The digital modem transmitter 204 formats and modulates the I2S data. The modulated data is then up-converted by the RF transmitter 206 to a radio frequency signal and transmitted out from the antenna 208. The power-control-LED block 214 may generate control signals, such as reset and power-on controls, to the digital modem transmitter 204 and RF transmitter 206. The digital modem transmitter 204 may generate monitor signals, such as for mute, to the power-control-LED block 214.

At digital wireless receiver 218, shown in FIG. 3, the RF receiver 224 receives from the antennas 220, 222 the transmitted signal and down converts the transmitted signal to a baseband signal. The baseband signal is then demodulated by the digital modem receiver 226 and formatted to I2S format. The I2S data is sent to the audio receiver 228. Audio DAC 230 converts the digital audio signal to a signal suitable for amplification by the speaker 232. The power-control-LED 234 may generate control signals, such as reset and power-on controls, to the digital modem receiver 226 and RF receiver 224. The digital modem receiver 226 may generate monitor signals, such as for mute and error rate indicators, to the power-control-LED 234.

Figure 4:
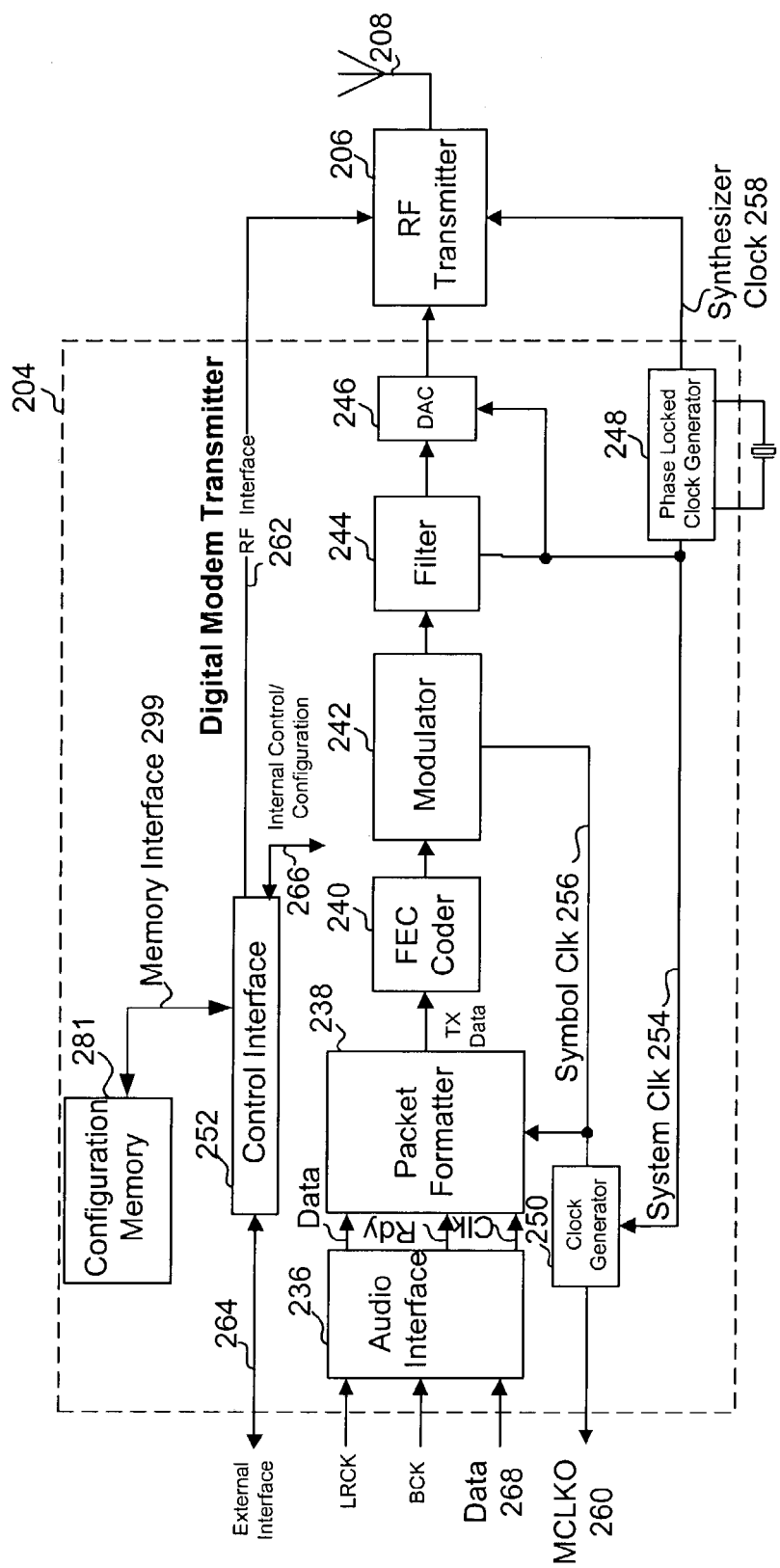
FIG. 4 shows a block diagram of an exemplary digital modem transmitter, according to embodiments of the present invention.

FIG. 4 shows an exemplary digital modem transmitter 204 that may be employed with embodiments of the present invention. According to preferred embodiments of the present invention, the digital audio input is based on the I2S digital audio standard format, which consists of LRCK, BCK, and the Data signals as shown in FIG. 4. According to embodiments of the present invention, the audio interface block 236 receives the LRCK, BCK, and the Data signals. Output data of the audio interface block 236 is accepted by the packet formatter block 238 once a ready signal is activated. The input data to the packet formatter block 238 may be buffered to ensure that the audio transmitter 210 (FIG. 2) sends the audio data without interruption. As discussed above, the digital audio input could be in any format. Because the audio input is digital, appropriate buffering and processing known in the art may be applied in the audio Interface block 236 to produce the format needed by the packet formatter 238. The symbol clock 256 is used to provide a synchronous interface between the audio interface block 236 and the packet formatter block 238. The packet formatter block 238 takes the data output from the audio interface block 236 and generates packets with a particular format, for example the format shown in FIG. 5. Once the data is formatted by the packet formatter block 238, it may be transferred serially to modulator 242.

In a preferred embodiment, where the audio format is based on I2S, the audio data arrives continuously at the audio Interface block 236 input with a rate of 2.8224 MHz or 3.072 MHz. Because the I2S generates audio data serially and because the audio data may need to be buffered, it may be necessary to implement a serial to parallel converter (not shown) so that data may be buffered into, for example, an eight bit or sixteen bit wide register file. The audio data may be buffered N blocks at a time. After N blocks are buffered, the buffered audio data is formatted by the packet formatter 238 into the packet format shown in FIG. 5. To reduce the latency, the packet formatter 238 should be clocked at a rate so that the packets can be formatted and transferred to the modulator 242 before the next N blocks of audio data has been buffered. A system clock 254 serves as the timing reference from which to generate the necessary clocks for this rate conversion. Other first in first out (FIFO) schemes may also be applied, according to embodiments of the present invention.

Figure 5:
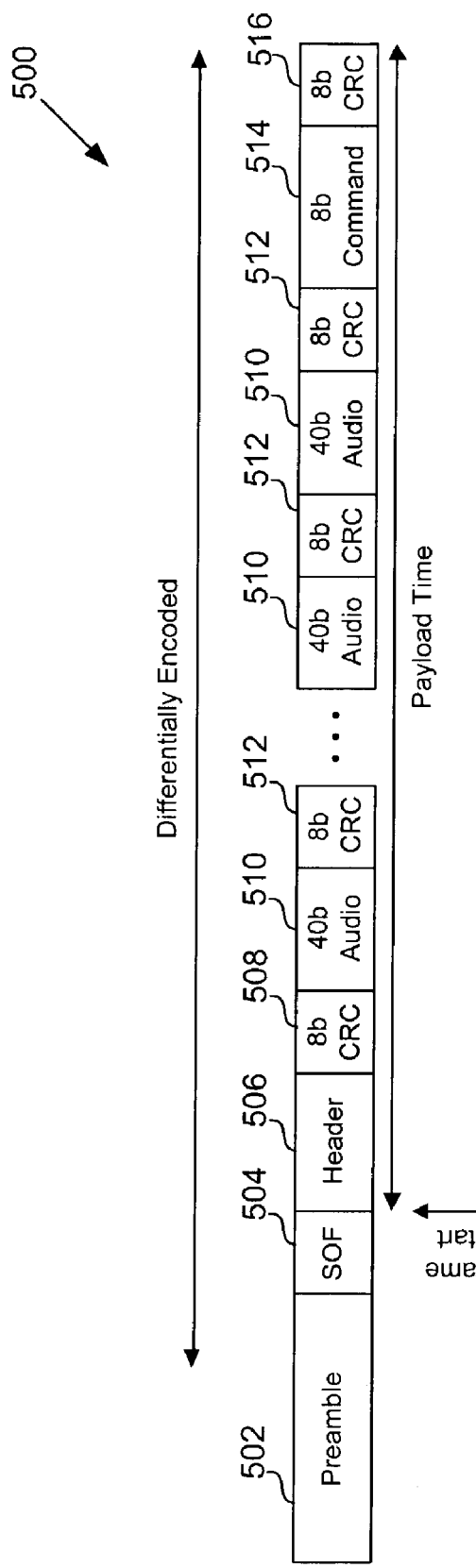
FIG. 5 shows an exemplary packet format, according to embodiments of the present invention.

An exemplary packet format that may be employed with embodiments of the invention is shown in FIG. 5. Packet 500 comprises a preamble 502 followed by a start-of-frame (SOF) field 504, a header 506 with a cyclic redundancy check (CRC) 508, N blocks of audio data 510 with a CRC 512 computed for each block, and a command field 514 followed by its own CRC 516. According to embodiments of the present invention, the packet formatter block 238 may also interleave the packet 500 prior to sending it to the forward error correction (FEC) coder 240 for more robust error concealment.

In one preferred embodiment, a typical packet may consist of a three bit SOF field, an eight bit header with an eight bit CRC, and N audio data blocks, each having an eight bit CRC. The packet may also optionally include an eight bit command field with an eight bit CRC. Each audio data block may be 40 bits long and the number of blocks N may be specified by the header field, which may consist of a 5 bit "length" field, a command indicator bit, and two reserved bits. An exemplary header field format, according to embodiments of the present invention, is shown in Table 1.

As shown in Table 1, the eight header bits are represented by the notation Header[7:0] (i.e., bits 0–7 of the header), where bit 7 is the most significant bit (MSB) and is transmitted first. Header[7:3] (i.e., bits 3–7 of the header) specify N, the number of audio data blocks 510 in the packet 500. A value of '00000' indicates that there are no audio data blocks and values '00001' to '11111' indicate that the number of audio data blocks are from 1 to 31. Thus, only one of the values '00001' to '11111' would be specified in the header for each packet to indicate the number of audio data blocks contained in the packet. Each audio data block 510 is defined as 40 bits plus an eight bit CRC.

Header[2] (i.e., bit 2 of the header) indicates whether the packet contains an eight bit command field followed by an eight bit CRC. A value of '0' indicates that there is no command field and a value of '1' indicates that there is a command field. Header[1:0] (i.e., bits 0–1 of the header) may be bits reserved for later use.

TABLE 1

(Header Format)

| Bit Allocation | Function | Valid Values | Parameter |
| --- | --- | --- | --- |
| Header[7:3] | Length field | 00000 | No audio data block |
|  |  | 00001–11111 | 1 to 31 audio data blocks |
| Header[2] | Command indicator | 0 | No command byte |
|  |  | 1 | Contains command byte |
| Header[1:0] | Reserved | NA | NA |

According to embodiments of the present invention, the preamble 502 of packet 500 may consist of M periods of a synchronization code. In preferred embodiments, the synchronization code may comprise the 11-bit Barker sequence or period, {−1, −1, −1, +1, +1, +1, −1, +1, +1, −1, +1}, known in the art. In other words, the 11-bit Barker sequence may be repeated M times to form the preamble 502. In other embodiments, other suitable synchronization codes may be used such as, but not limited to, pseudo noise (PN) codes (such as maximal length sequence (M sequence)), a Kasami sequence and a Gold sequence.

Moreover, according to embodiments of the present invention, the latter portion of the preamble 502, as well as all of SOF field 504, may be modulated using differentially encoded phase shift keying (PSK) while the audio data blocks 510 of packet 500, as well as header 506, may be modulated using a different modulation scheme. If the modulation scheme is different for the audio data blocks 510 and header 506, the modulator 242 (FIG. 4) may change the modulation scheme after the SOF field 504 has been sent. In a preferred embodiment, a typical preamble length is 15 periods of the Barker sequence with 11 of the periods not differentially encoded. In other words, the first 11 periods of the Barker sequence are not differentially encoded, while the last four periods are differentially encoded.

Referring again to FIG. 4, the packet 500 (FIG. 5) is sent to the FEC coder 240, which may encode the data to be transmitted (TX data) to provide robustness against noise and interference. The encoded data is then sent from the FEC coder 240 to the modulator 242. Modulator 242 maps its input to a discrete analog waveform based on modulation methods known in the art. According to preferred embodiments of the present invention, the modulation method may be either binary phase shift key (BPSK) or quaternary phase shift keying (QPSK).

The modulated signal is then sent to a filter 244 which rejects images generated by the sampling process and reduces sidebands generated outside the main signal bandwidth The filter 244 is clocked by the system clock 254, which is typically four to eight times the frequency of the symbol clock 256. The filter 244 should interpolate the incoming slower samples to samples at a rate equal to an over-sampled clock rate. Filter 244 may be constructed based on methods known in the art.

The output of filter 244 is then sent to the RF transmitter 206, after conversion to an analog signal through the DAC 246. The RF transmitter 206 may be implemented with a variety of different architectures, such as, but not limited to, direct-conversion, low-intermediate frequency (low-IF), or super-heterodyne. RF transmitter 206 includes antenna 208 for transmitting the RF signal.

A phase-locked clock generator 248 generates the system clock 254 and the synthesizer clock 258. The synthesizer clock 258 is used by the RF transmitter 206 to synthesize the RF carrier. The system clock 254 is the over-sampled clock and, as stated above, is usually operated at a frequency four to eight times greater than the symbol clock 256. The symbol clock 256 is generated by the clock generator 250 by means of divider circuits in a manner known in the art. The clock generator 250 also provides a MCLKO signal 260 externally to facilitate interfacing with its audio data input, such as I2S. The MCLKO signal 260 is derived from the system clock 254 through divider circuits. According to alternative embodiments, separate crystal references may be used by RF transmitter 206 and digital modem transmitter 204 in place of the phase-locked clock generator 248. In addition, a non-volatile memory 281 may be used to provide an initial configuration to the to the digital modem transmitter 204 through the memory interface 299.

Figure 6:
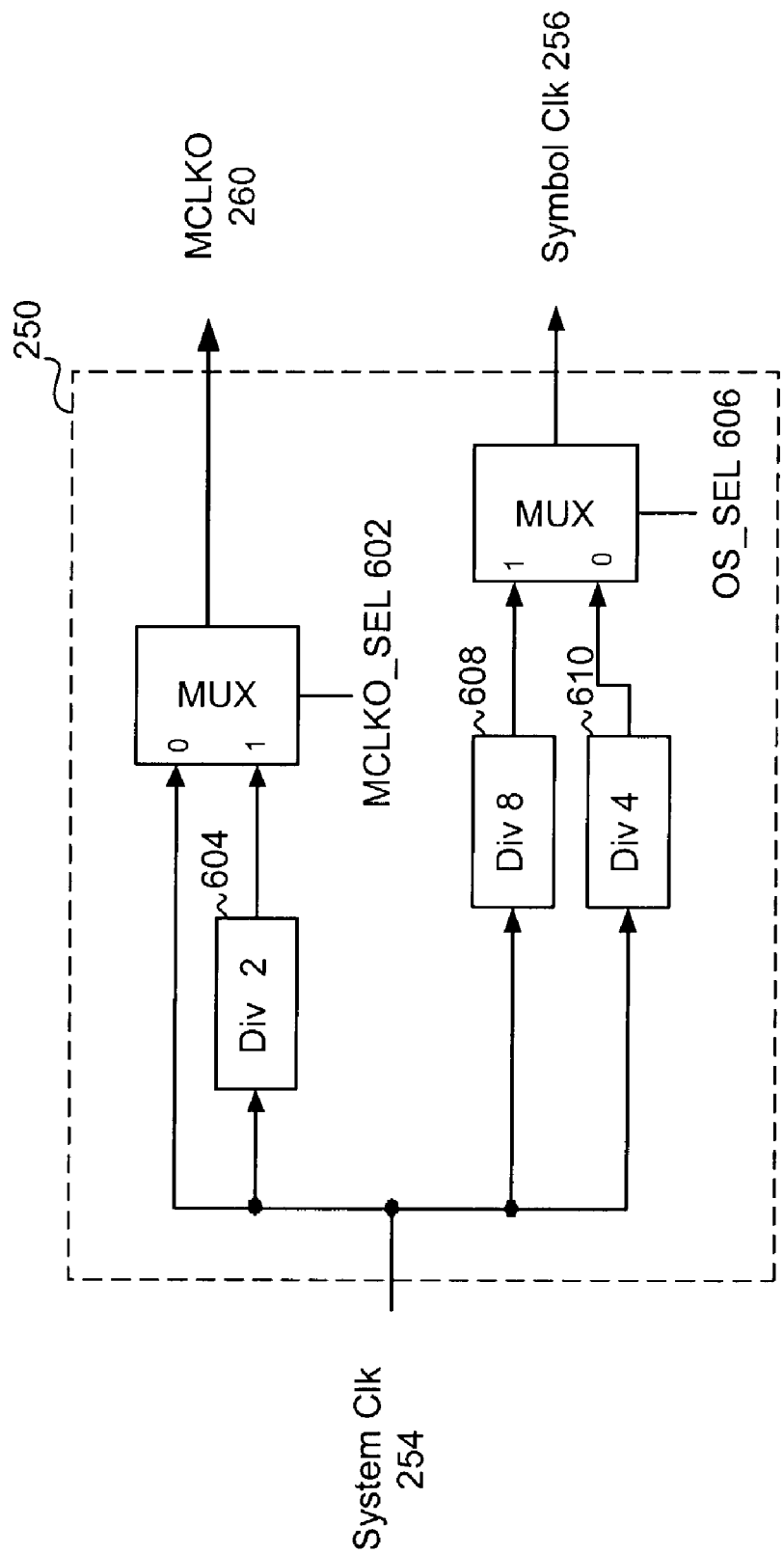
FIG. 6 shows a clock generator that may be employed in the transmitter shown in FIG. 4, according to embodiments of the present invention.

FIG. 6 shows a block diagram of clock generator 250, according to embodiments of the present invention. The MCLKO signal 260 is derived from the system clock 254 and selected by MCLK_SEL 602. If MCLKO_SEL 602=1, then the output of divide-by-2 block 604 is used as MCLKO 260. If MCLKO_SEL 602=0, then system clock 254 is used as MCLKO 260. The symbol clock 256 is derived from the system clock 254 and selected by OS_SEL 606. If OS_SEL 606=1, then the output of the divide-by-8 block 608 is used as symbol clock 256. If OS_SEL 606=0, then the output of the divide-by-4 block 610 is used as symbol clock 256. All divide-by circuits are positive-edge triggered.

Referring again to FIG. 4, the control interface section 252 of digital modem transmitter 204 implements the RF interface 262, external interface 264, and the logical operations (internal control/configuration) 266. The RF interface 262 serves to control the RF transmitter 206, such as by setting the channel frequency and transmit power of the RF transmitter 206. For robust reception in the presence of interference in shared bands, such as, but not limited to, the ISM band, RF transmitter 206 may be configured using RF interface 262 to transmit around the following specific center frequencies:

5.165 Giga Hertz (GHz), 5.19 GHz, 5.21 GHz, 5.23 GHz, 5.25 GHz, 5.27 GHz, 5.29 GHz, 5.31 GHz, 5.335 GHz, 5.735 GHz, 5.755 GHz, 5.775 GHz, 5.795 GHz, 5.815 GHz, 2.427 GHz, 2.4245 GHz or 2.425 GHz, 2.457 GHz, 2.4495 GHz or 2.450 GHz, and 2.47275 GHz or 2.473 GHz.

Typical parameters for digital modem transmitter 204, according to embodiments of the present invention, are shown in Table 2. The signal rates are different depending on the audio sampling rates, which, according to preferred embodiments of the present invention, may either be 44.1 kilo Hertz (kHz) or 48 kHz.

TABLE 2

(Summary of parameters for the transmitter)

| Parameter | Audio Sample Rate | Value |
|---|---|---|
| System clock rate ($f_{sys}$) | 44.1 kHz | 22.5792 MHz |
| | 48 kHz | 24.5760 MHz |
| Audio data rate | 44.1 kHz | 1.764 Mbps |
| | 48 kHz | 1.92 Mbps |
| Symbol clock rate | NA | ($f_{sys}$/4 or $f_{sys}$/8) |
| I2S BCK rate | 44.1 kHz | 2.8224 MHz |
| | 48 kHz | 3.072 MHz |
| I2S LRCK rate | 44.1 kHz | 44.1 kHz |
| | 48 kHz | 48 kHz |
| I2S MCLKO rate | 44.1 kHz | 11.2896 MHz (MCLKO_SEL = 0) |
| | | 22.5792 MHz (MCLKO_SEL = 1) |
| | 48 kHz | 12.2880 MHz (MCLKO_SEL = 0) |
| | | 24.5760 MHz (MCLKO_SEL = 1) |

According to preferred embodiments, the audio data rate is equal to 20 bits * audio sample rate. For audio sample rates of 44.1 kHz and 48 kHz, the audio data rates are 1.764 mega bits per second (Mbps) and 1.92 Mbps, respectively. The I2S BCK rate includes the overhead in the I2S packet format. There are 32 bits per channel in the I2S packet. Therefore, the I2S BCK rate is equal to 64 bits * audio sample rate. For audio sample rates of 44.1 kHz and 48 kHz, the audio data rates are 2.8224 mega Hertz (MHz) and 3.072 MHz, respectively. BCK is also eight times slower than the system clock rate ($f_{sys}$).

Figure 7:
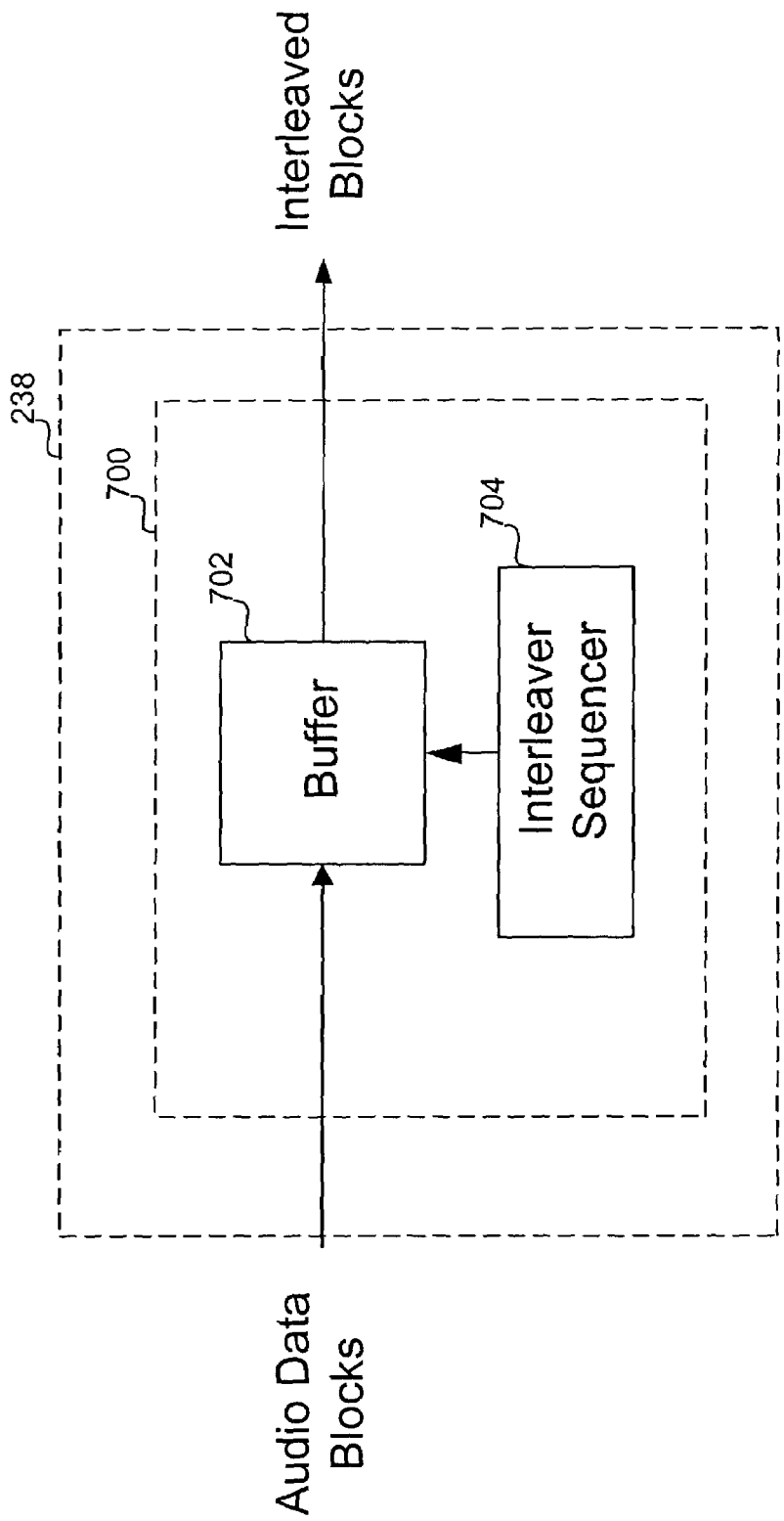
FIG. 7 shows a block diagram of an exemplary audio data block interleaver that may be employed in the transmitter shown in FIG. 4, according to embodiments of the present invention.

As shown in FIG. 7, to achieve robust reception in the presence of interference, noise, and/or fading, while preserving the audio quality, embodiments of the present invention implement an audio data block interleaver 700 in the packet formatter block 238. N audio data blocks are sent to a buffer 702. The order at which data is retrieved from the buffer is determined by a interleaver sequencer 704. Interleaver sequencer 704 reorders the sequence at which the N audio data blocks are retrieved from the buffer 702. The interleaved blocks are then formatted into a packet 500 having a format as shown in FIG. 5. The packet 500 is then sent to the modulator 242 for transmission.

The interleaving sequence may be based on methods known in the art, such as, but not limited to, those used for block and convolutional interleavers. Embodiments of the present invention interleave a block of data rather than one bit. This offers an advantage, as it is not necessary to code the blocks of data, whereas conventional interleavers may code the bits and interleave the bits prior to transmission. However, coding of individual bits may be implemented in some embodiments of the present invention in addition to interleaving of data blocks.

Figure 8:
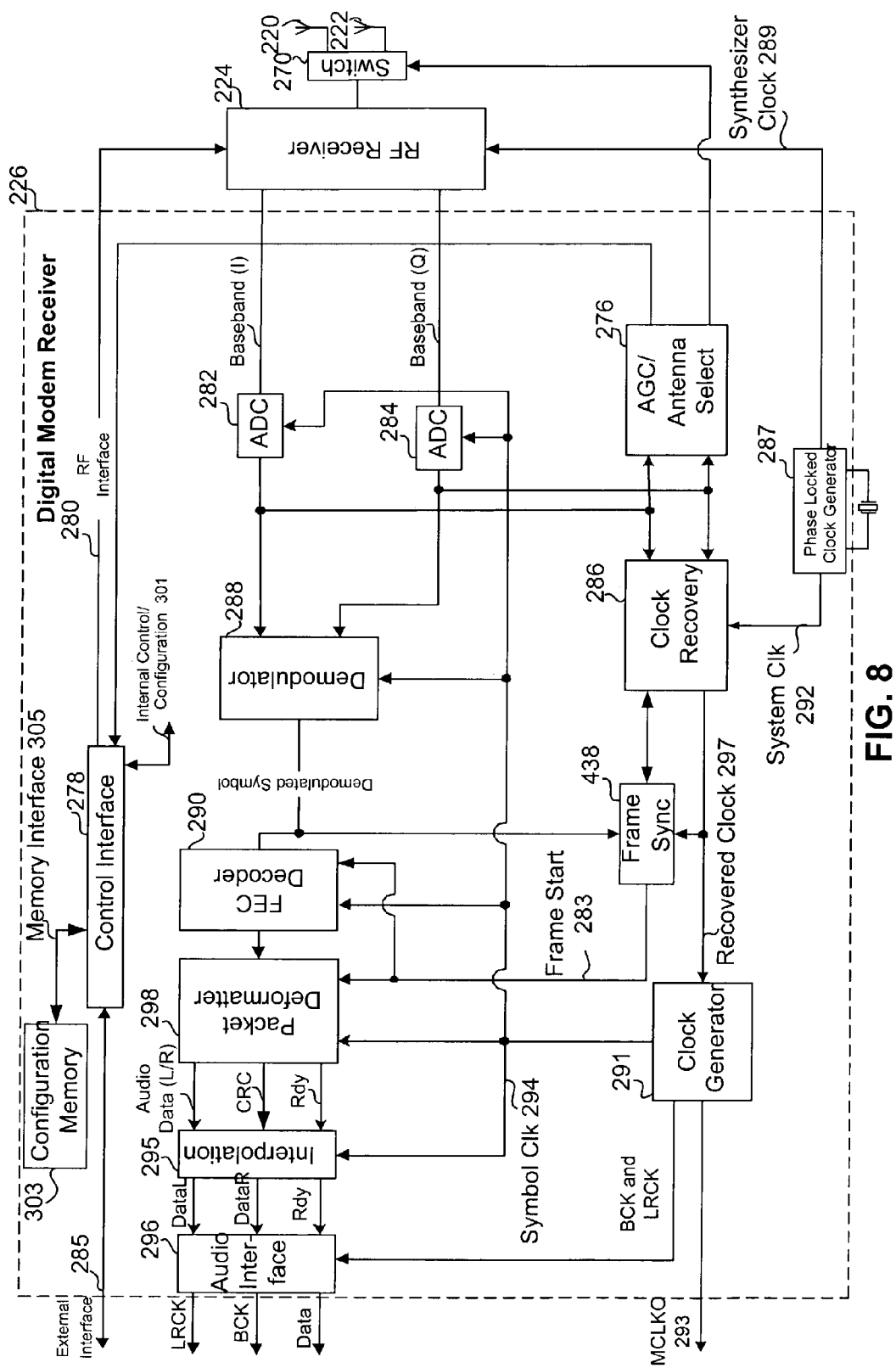
FIG. 8 shows a block diagram of an exemplary digital modem receiver that may be employed with embodiments of the present invention.

FIG. 8 shows an exemplary digital modem receiver 226 that may be employed with embodiments of the present invention. The input of the RF receiver 224 may include an antenna switch 270 that selects one of the two antennas 220, 222, depending on a received signal strength indicator (RSSI) value. The decision logic to determine which antenna is being selected is implemented in the automatic gain control (AGC)/antenna select block 276. The output of the antenna switch 270 is then processed by the RF receiver 224.

The configuration of the RF receiver 224 is set by the control interface section 278 through the RF interface 280, which may be implemented by methods known in the art. The gain of the RF receiver 224 is set by the AGC/antenna select block 276, which determines the gain settings based on the RSSI value. The outputs of the RF receiver 224 are the in-phase (I) and quadrature (Q) components of the baseband received signal.

In the digital modem receiver 226, two ADCs 282, 284 may be employed to digitize, respectively, the I and Q received baseband signals. The sampling of the ADC's is controlled by the clock recovery block 286. The digitized I and Q signals are sent to the demodulator 288 to recover the data in digital format. The demodulator 288 uses the digital I and Q data to recover the transmitted symbols using methods known in the art. According to embodiments of the present invention, because, as discussed above, the preamble 502 and the audio data blocks 510 of the packet 500 (FIG. 5) may be modulated using different modulation schemes, the demodulator 288 may support multiple modulation schemes in order to demodulate the different modulations used before and after the SOF field 504 of the packet 500.

Figure 9:
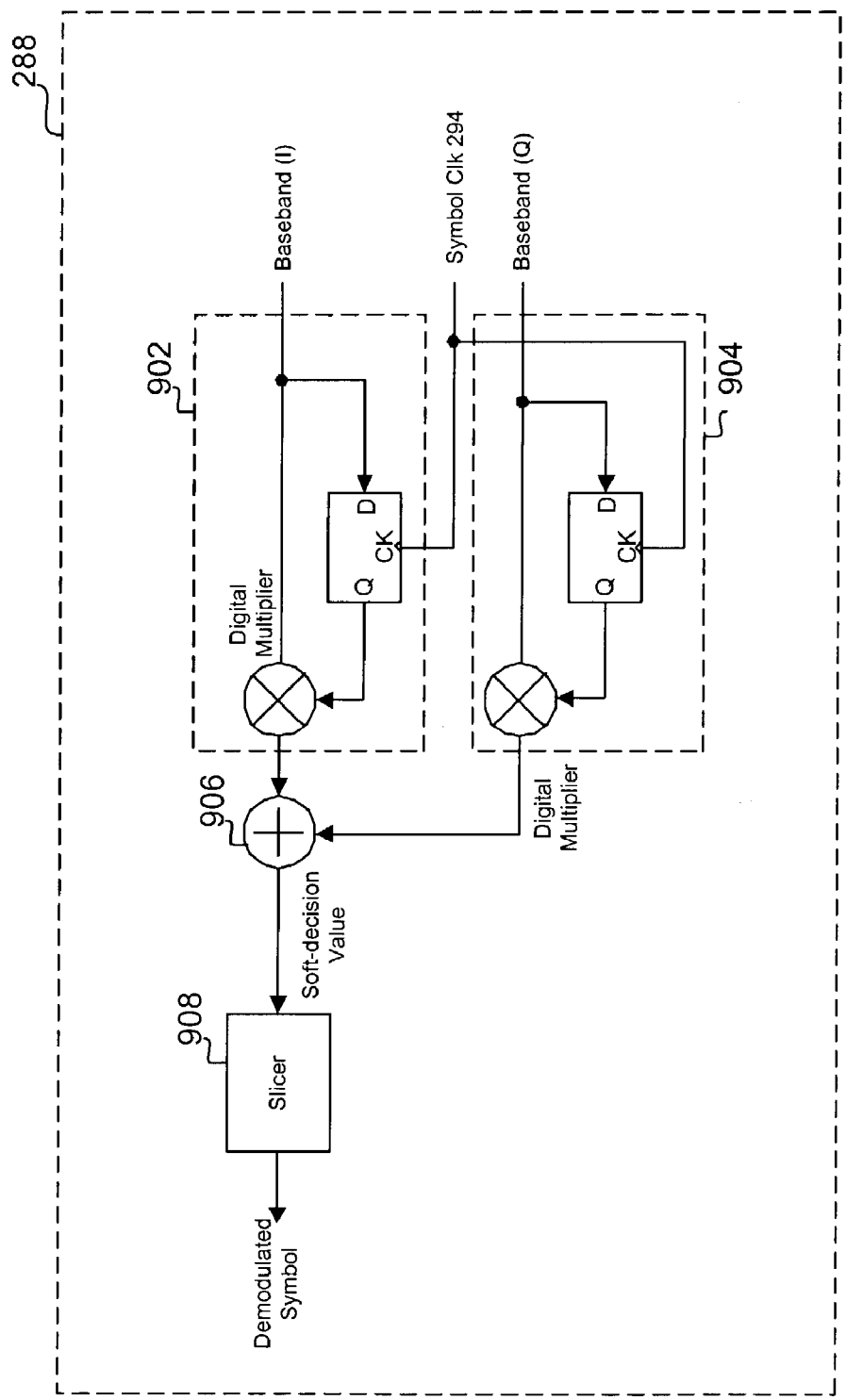
FIG. 9 shows a non-coherent demodulator that may be employed in the digital modem receiver shown in FIG. 8, according to embodiments of the present invention.

In a preferred embodiment, a non-coherent demodulator such as that shown in FIG. 9 may be used as the demodulator 288. However, any suitable demodulator may be employed with embodiments of the present invention. The non-coherent demodulator shown in FIG. 9 comprises two differential detectors 902, 904. The registers of the two differential detectors 902, 904 are clocked at the rate of the symbol clock 294. Each detector multiplies a channel of the received baseband signal by a version of the signal that has been delayed by the period of the symbol clock 294. The two outputs of the detectors are summed at adder 906 to form a soft decision value. The soft decision value is sent to slicer 908 so that a symbol decision may be made. The slicer 908 takes the soft decision value and generates a demodulated symbol at its output.

According to embodiments of the present invention, the non-coherent demodulator shown in FIG. 9 may demodulate differentially encoded BPSK signals. For BPSK, the demodulated symbol is either +1, represented by a '0', or −1, represented by a '1'. The slicer 908 may simply take the sign bit of the soft decision value to perform the above mapping.

Referring again to FIG. 8, the demodulated symbols are sent from demodulator 288 to an FEC decoder 290 to recover the originally transmitted data. The FEC decoder 290 uses the symbol clock 294 to generate the clocks required to decode the demodulated data. The FEC decoder 290 may be implemented with methods known in the art.

The decoded data is then sent to the packet deformatter 298. The packet deformatter 298 takes the demodulated symbols and deformats the packet 500 (FIG. 5) into its header, data, and command (if any). The length field information in the header 506 is used to deformat the packet 500. The packet deformatter 298 uses the frame start signal 283 and symbol clock 294 to strip out the header 506 and CRC 508 of packet 500. The frame start signal 283 is issued by the frame sync block 438 according to the start of frame timing shown in FIG. 5. The frame sync block 438 utilizes control signals from the clock recovery block 286, as well as the SOF field 504 to determine the start of frame. In some embodiments, the received data may be buffered in a FIFO memory (not shown). According to embodiments of the present invention, the length field may be deleted so that the packet deformatter 298 can still deformat the packet when the header is in error.

The CRC 512 and audio data blocks 510 are sent to the interpolation section 295. The received audio data blocks 510 may be buffered in a FIFO (not shown). If the CRC 512 is not passed, the interpolation section 295 performs operations to conceal errors in the corresponding audio data so that quality is not degraded appreciably.

The interpolation section 295 then passes the audio data to the audio interface block 296 for processing. The output of the audio interface block 296 may be, for example, in the I2S digital audio standard format, which consists of LRCK, BCK, and the data signals.

The control interface section 278 implements the RF interface 280, external interface 285, and the internal control/configuration 301. The RF interface 280 serves to control the RF receiver 224, such as by setting the channel frequency and transmit power of the RF receiver 224. Additionally, the control interface 278 interfaces through memory interface 305 with con-volatile configuration memory 303 for configuration of the digital modem receiver 226.

A phase-locked clock generator 287 generates the system clock 292 and the synthesizer clock 289. The synthesizer clock 289 is used by the RF receiver 224 to synthesize the RF carrier. The system clock 292 is the over-sampled clock and may have a frequency four to eight times greater than the symbol clock 294. The symbol clock 294 is generated by the clock generator 291 by means of divider circuits in a manner known in the art. The clock generator 291 also provides a MCLKO signal 293 externally to facilitate interfacing with its audio data outputs. The MCLKO signal 293 is derived from the recovered clock 297 through divider circuits in a manner known in the art.

Typical parameters for digital modem receiver 226, according to embodiments of the present invention, are shown in Table 3. The signal rates are different depending on the audio sampling rates, which, according to preferred embodiments of the present invention, may either be 44.1 kilo Hertz (kHz) or 48 kHz.

TABLE 3

(Summary of parameters for the receiver)

| Parameter | Audio Sample Rate | Value |
|---|---|---|
| System clock rate ($f_{sys}$) | 44.1 kHz | 22.5792 MHz |
|  | 48 kHz | 24.5760 MHz |
| Audio data rate | 44.1 kHz | 1.764 Mbps |
|  | 48 kHz | 1.92 Mbps |
| Symbol clock rate | NA | ($f_{sys}/4$ or $f_{sys}/8$) |
| I2S BCK rate | 44.1 kHz | 2.8224 MHz |
|  | 48 kHz | 3.072 MHz |
| I2S LRCK rate | 44.1 kHz | 44.1 kHz |
|  | 48 kHz | 48 kHz |
| I2S MCLKO rate | 44.1 kHz | 11.2896 MHz (MCLKO_SEL = 0) |
|  |  | 22.5792 MHz (MCLKO_SEL = 1) |
|  | 48 kHz | 12.2880 MHz (MCLKO_SEL = 0) |
|  |  | 24.5760 MHz (MCLKO_SEL = 1) |

As stated above, the packet deformatter 298 takes the demodulated symbols and deformats the packet 500 into its header, data, and command (if any). The packet deformatter 298 takes the demodulated symbols and extracts the audio data blocks 510 and the associated CRCs 512. CRC 512 is '1' when the corresponding audio data block is in error and '0' when the audio data block 510 is free of errors.

According to embodiments of the present invention, the interpolation section 295 performs operations to conceal errors in the corresponding audio data based on the CRCs 512 so that quality is not degraded appreciably. The interleaved audio data block 510 together with their associated CRCs 512 are sent to the interpolation section 295 whereby the audio data block 510 and CRC 512 are transferred at the audio rate of either 44.1 kHz or 48 kHz.

Figure 10:
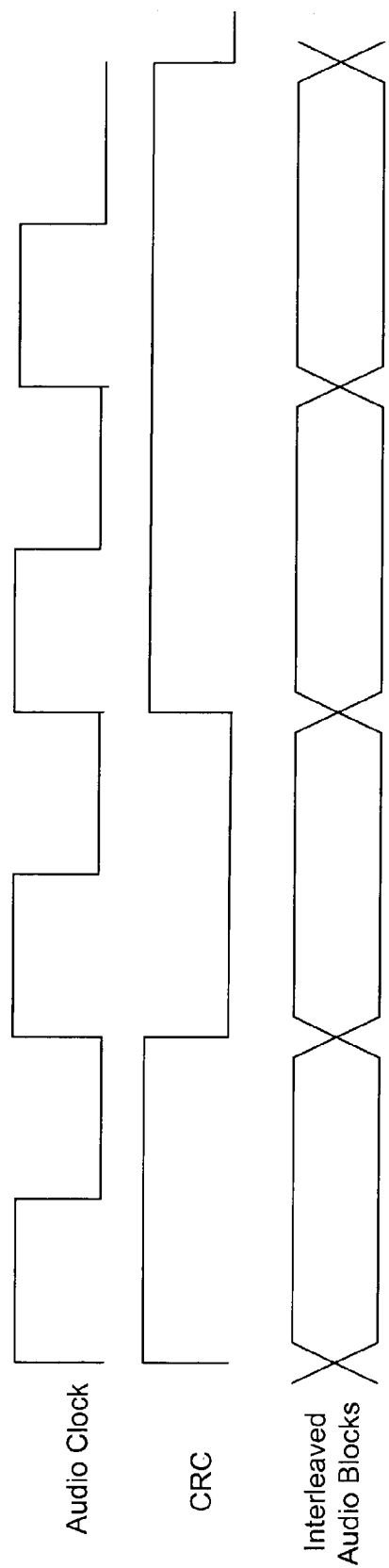
FIG. 10 shows a timing diagram showing an exemplary alignment of a CRC and an audio data block, according to embodiments of the present invention.

According to embodiments of the present invention, the CRC 512 and the audio data block 510 should be aligned as shown in the example waveform shown in FIG. 10. To minimize the latency in processing, the packet deformatter 298 could be clocked faster and the CRC 512 may be shorter. However, the phase relationship should be maintained at the audio data block boundary.

In the case where one or more packets 500 are dropped before the packet deformatter 298 can process the audio data blocks 510 contained in those packets 500, the associated CRCs 512 cannot be computed. Therefore, the interpolation section 295 is not aware of audio data block errors generated in the dropped packets 500. To handle such a case, according to embodiments of the present invention, the packet deformatter 298 detects a packet drop and sends the CRC 512 pulses corresponding to the dropped audio data blocks 510 to the interpolation section 295. The interpolation section 295 will then conceal the errors introduced by the dropped audio data blocks 510. Note that a packet 500 could be dropped due to errors in the header 506.

After processing, the interpolation section 295 sends the audio data, both left (DataL) and right (DataR) channel, to the audio interface block 296. Audio interface block 296 converts the audio data to the appropriate digital format. As discussed above, according to a preferred embodiment, the format is I2S. The clock for the audio interface block 296 is BCK and LRCK and is generated by the clock generator 291 using the recovered clock 297 through divider circuits in a manner known in the art. Once the ready signal (Rdy) signal is activated, the interpolation section 295 sends data to the audio interface block 296 for processing. The symbol clock 294 is used to provide a synchronous interface between the audio interface block 296 and the interpolation section 295. The audio interface block 296 should retime the input data so that the transmitted audio data is synchronous with BCK and that the left/right channel data is aligned to LRCK. Both BCK and LRCK needed for this rate conversion is generated from the symbol clock 294 in the clock generator 291. In FIGS. 4 and 8, the signals BCK, Data, LRCK, and MCLKO are shown because they are used by typical audio decoders using the I2S format. The signals for other formats may require other signals for the input/output.

Figure 11:
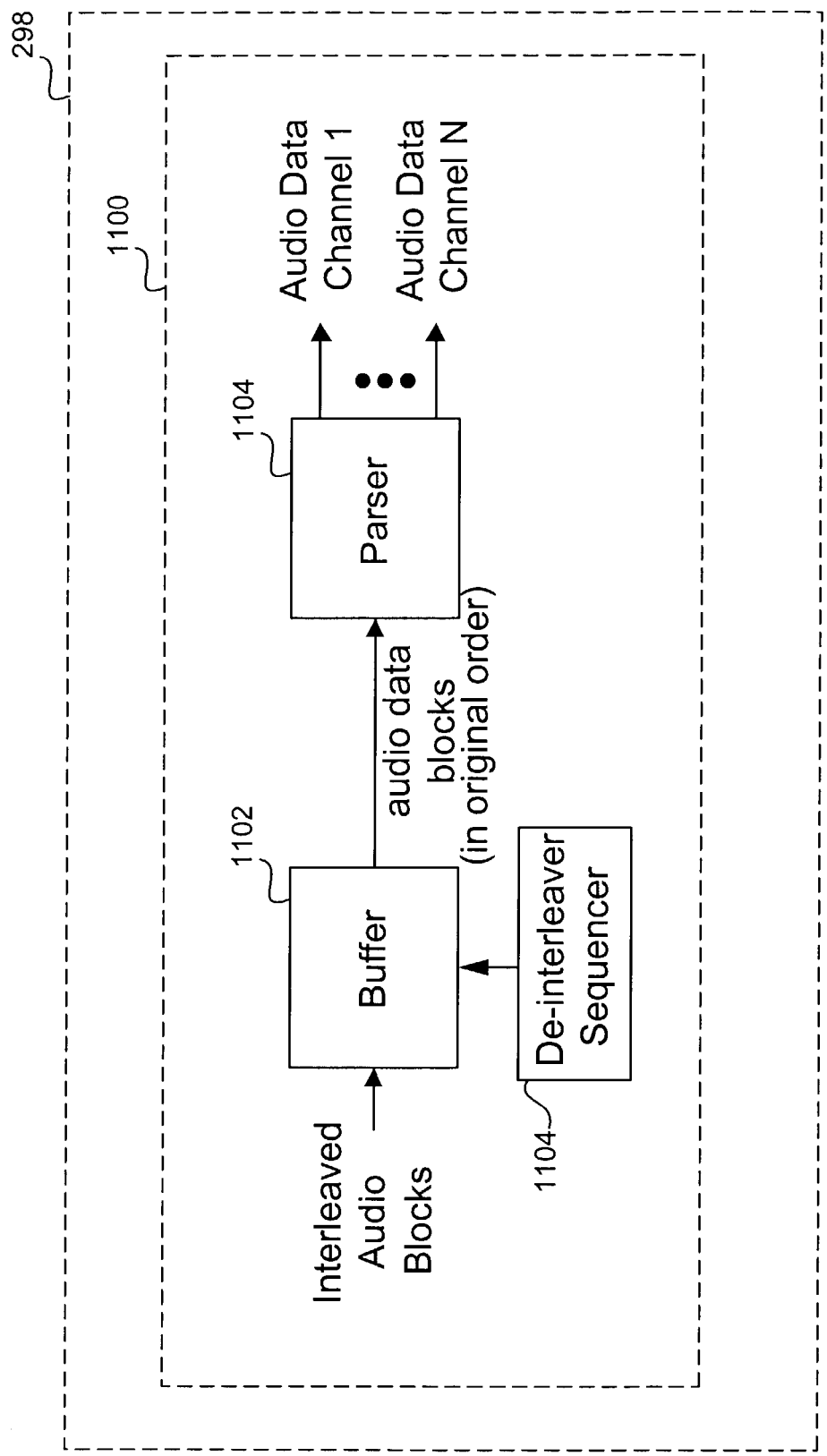
FIG. 11 shows a block diagram of an audio data block de-interleaver that may be employed in the digital modem receiver shown in FIG. 8, according to embodiments of the present invention.

As discussed above, according to embodiments of the present invention, the audio data block interleaver 700 (FIG. 7) is implemented in the packet formatter 238 (FIG. 4) to spread out the audio data block 510 errors over the entire packet 500. Therefore, according to embodiments of the present invention, before sending the recovered audio data blocks 510 to the interpolation section 295, the recovered audio data blocks 510 should be put back to their original order. The audio data block de-interleaver 1100 is implemented in the packet formatter 298, as shown in FIG. 11. N interleaved audio data blocks 510 are sent to a buffer 1102. The order at which data is retrieved from the buffer is determined by a de-interleaver sequencer 1104. The de-interleaver sequencer 1104 reverts the ordering performed by the interleaver sequencer 704 at the digital wireless transmitter 202.

According to embodiments of the present invention, the audio data blocks 510 may contain multiple audio data channels. In such a case, embodiments of the audio data block de-interleaver 1100 may include parser 1104, as shown in FIG. 11. Parser 1104 parses the audio data blocks 510 into data corresponding to N audio channels. The multi-channel outputs are then sent to the interpolation section 295 (FIG. 8) for further processing. According to further embodiments, an audio data block 510 may correspond to data from one of the audio channels. In other words, data from each audio channel will have its own CRC 512. In a preferred embodiment, each audio data block consists of two channels, Audio Data (Right) and Audio Data (Left), each being 20 bits.

Figure 12:
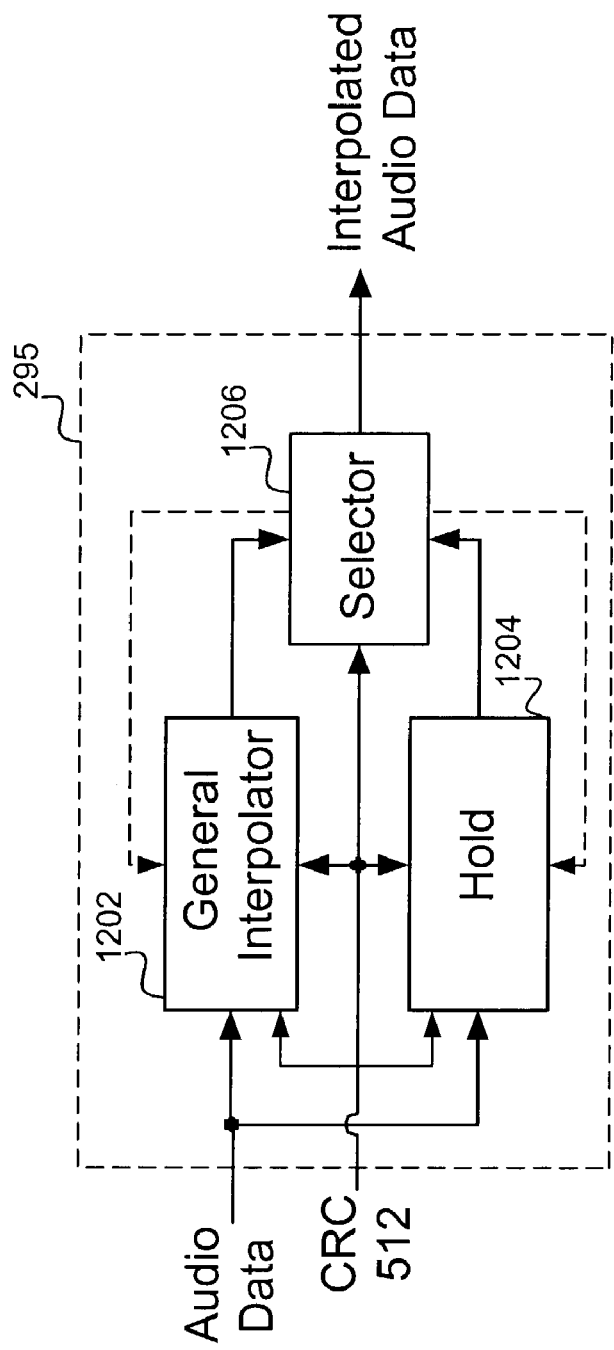
FIG. 12 shows a block diagram of an exemplary interpolation section that may be employed in the digital modem receiver shown in FIG. 8, according to embodiments of the present invention.

As shown in FIG. 12, according to embodiments of the present invention, the interpolation section 295 (FIG. 8) comprises a general interpolation block 1202 that may implement any of the interpolation methods available, such as linear interpolation, second-order interpolation, third-order interpolation and the like. In parallel to the general interpolation block 1202 is a hold block 1204 that holds the most recent "clean" audio data block 510 (or at least partially processed audio data block 510 received from general interpolation block 1202) which is not in error. According to other embodiments of the present invention, the input of the hold block 1204 may not be in parallel with the input of the general interpolator 1202. For example, according to one embodiment, the hold block 1204 may be located within general interpolator 1202. Thus, the audio data may enter the general interpolator 1202 before entering the hold block 1204.

The outputs from general interpolation block 1202 and hold block 1204 are sent to a selector block 1206 that selects the output from the general interpolation block 1202 or the output from the hold block 1204, depending on the status of the CRC 512 input. According to embodiments of the present invention, generally, the output of the hold block 1204 is selected for error patterns that degrade the results of the general interpolation block 1202 significantly. Under more favorable error conditions, the output of the general interpolation block 1202 is selected. In addition, the selector block 1206 may enable hold block 1204 as well as additional hold blocks that may be used in the general interpolation block 1202. This enablement control is shown schematically in FIG. 12 by dashed lines from selector block 1206 to general interpolation block 1202 and hold block 1204.

Figure 13:
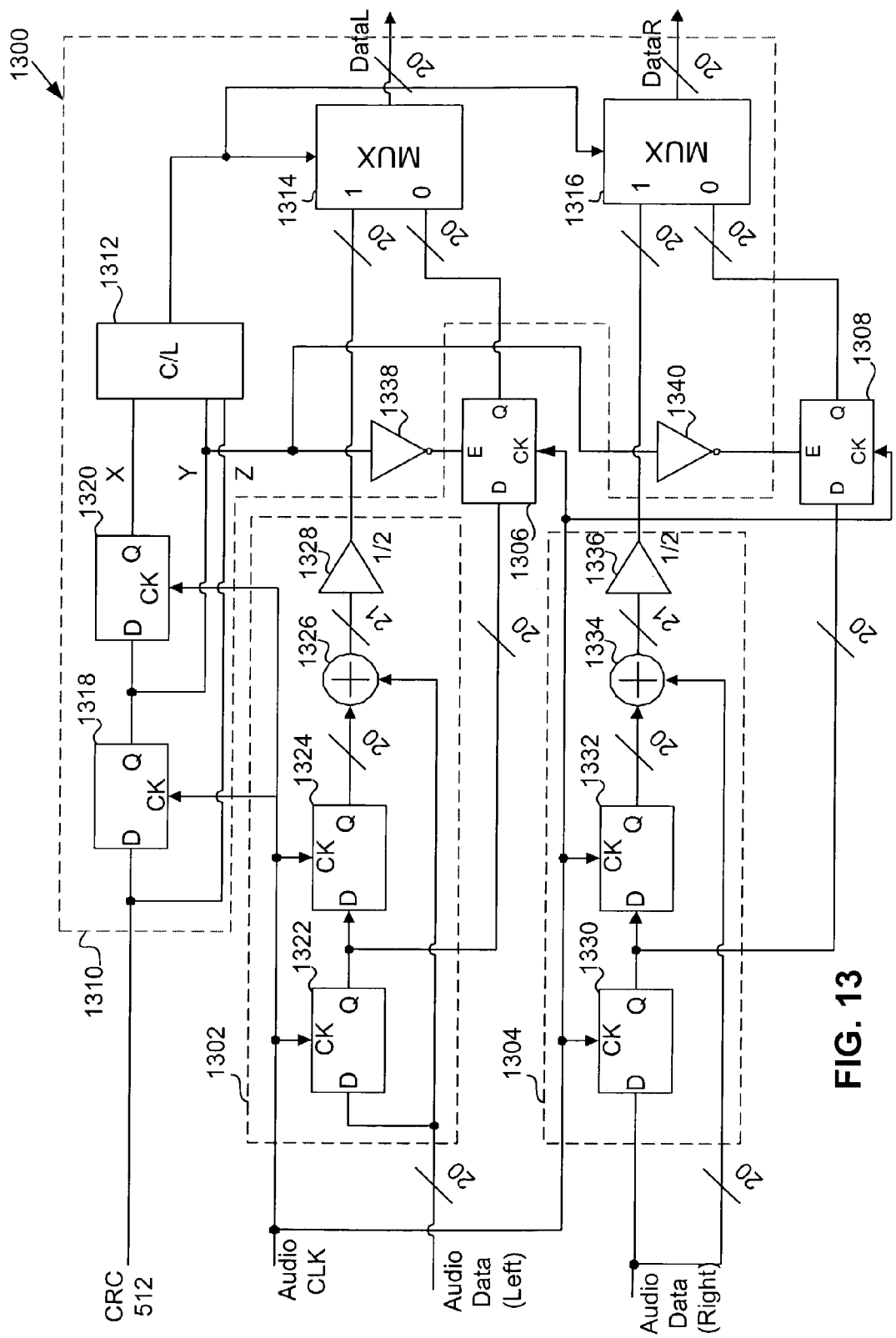
FIG. 13 shows an exemplary first-order interpolation block that may be employed in place of the general interpolation block shown in FIG. 12, according to embodiments of the present invention.

FIG. 13 shows an embodiment of a first-order interpolation block 1300 that may be employed in place of the general interpolation block 1202 shown in FIG. 12. For clarity, different sections of the first-order interpolation block 1300 corresponding to the sections shown in FIG. 12 are shown enclosed by broken lines. Thus, first-order interpolation block 1300 includes left audio data and right audio data linear interpolator sections 1302, 1304, as well as left audio data and right audio data hold registers 1306, 1308. First-order interpolation block 1300 further includes a selector section 1310 having combinational logic (C/L) block 1312 and left audio data and right audio data MUXs 1314, 1316.

According to embodiments of the present invention, the selector section of first-order interpolation block 1300 receives as an input a CRC 512 from the packet deformatter 298 to determine whether to select linear interpolation of two audio samples or to select hold on the most recent good audio sample. As discussed above, CRC 512 is '1' when the corresponding audio data block 510 is in error and '0' when the audio data block 510 is free of errors.

According to embodiments of the present invention, all registers of first-order interpolation block 1300 are positive-edge triggered. The registers are clocked by a clock at a multiple of 44.1 kHz or 48 kHz. The specific speed should be set so that the first-order interpolation block 1300 can process the data before the previous audio data blocks have been processed by the audio interface block 296 (FIG. 8).

Left audio data and right audio data linear interpolator sections 1302, 1304 receive as inputs, respectively, the Audio Data (Left) and Audio Data (right) signals, which is the left and right audio data from the received packets after de-formatting and de-interleaving. The Audio Data (Left) signal is input to a first register 1322. The output of the first register 1322 is provided as an input to adder 1326 and as an input to second register 1324. The output of second register 1324 is provided as an input to the adder 1326. The output of adder 1326 is provided to the input of a divider 1328, the output of which is provided to a first input of MUX 1314. A similar circuit is provided for the Audio Data (right) signal, which includes registers 1330, 1332, adder 1334 and divider 1336. The output of divider 1336 is provided to a first input of MUX 1316. The registers 1306, 1308, 1318, 1320, 1322, 1324, 1330 and 1332 may be, for example, D-type flip-flops or RS flip-flops.

Combinational logic (C/L) block 1312 receives as inputs X, Y and Z vectors which are CRC's for corresponding temporally adjacent audio data blocks 510. As discussed above, the CRC will be '1' when an audio data block 510 is in error and '0' when an audio data block 510 is free of errors ('1').

Vector X is delayed by both registers 1318 and 1320. Vector Y is delayed by register 1318. Vector Z is not delayed. The combinational logic (C/L) block 1312 generates a logic '1' when its input vector (XYZ) pattern is '010'. In other words, the condition wherein a first audio data block 510 is in error ('1'), and two audio data blocks 510 temporally adjacent to the first audio data block 510 are free of errors ('0'). When the '010' condition occurs, the outputs of the linear interpolator sections 1302, 1304 are selected through the MUXs 1314, 1316. This is because when the '010' condition occurs, the linear interpolator sections 1302, 1304 may satisfactorily conceal the error through interpolation. In all other cases, the outputs of the hold registers 1306, 1308 are selected to pass through the MUXs 1314, 1316.

The hold registers 1306, 1308 hold the last good audio data block 510. Hold registers 1306, 1308 have an enable line (E) that allows the signals at the inputs of hold registers 1306, 1308 to be received by hold registers 1306, 1308 only when the enable line is set to '1' (i.e., when the enable line is active). Otherwise, i.e., when the enable line is not active ('0'), the outputs of hold registers 1306, 1308 are held at their previous good value. The enable lines of hold registers 1306, 1308 will be set to '1' whenever Y is '0' using inverters 1338, 1340.

Thus, according to embodiments of the present invention, depending on the CRC pattern (XYZ) over three audio data blocks 510, either the output of the linear interpolator sections 1302, 1304 or outputs of the hold registers 1306, 1308 will be selected to be provided as DataL and DataR to the audio interface block 296 (FIG. 8). The interpolator output may or may not be selected depending on the XYZ patterns, i.e. the error patterns of the audio data. When the interpolator output is not selected based on the error patterns of the audio data, previously received audio data not corrupted by errors and held in the hold registers 1306, 1308 is provided as DataL and DataR to the audio interface block 296. In this manner, embodiments of the present invention improve the error concealment function.

According to the embodiment of the linear interpolator shown in FIG. 13, the data path within the linear interpolator sections 1302, 1304 should be kept at full precision but truncate to 20 bits because the audio data for both channels are 20 bits in length. According to other embodiments, the truncation could differ depending on the length of the audio data for the particular system being implemented.

Figure 14:
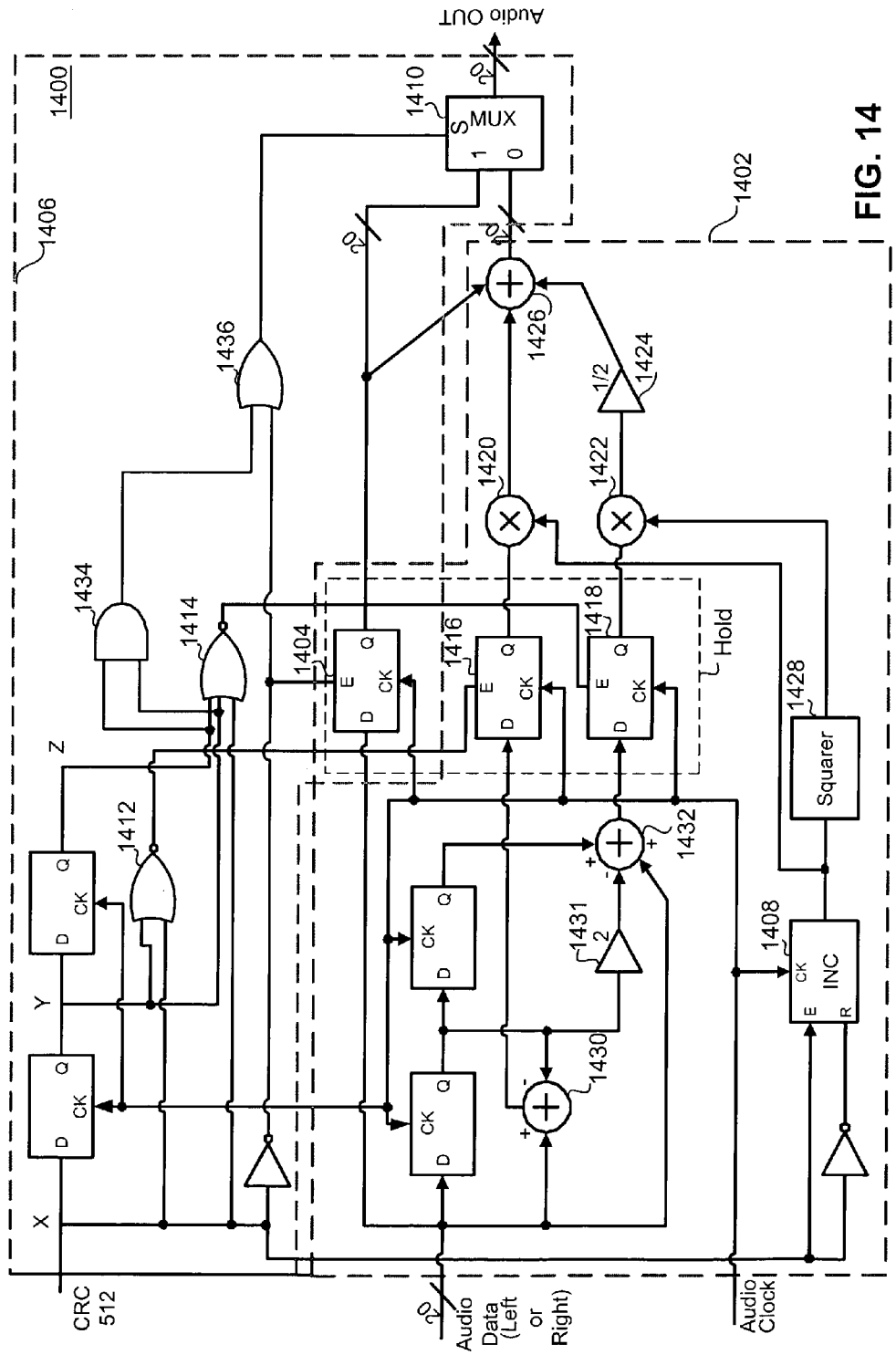
FIG. 14 shows an exemplary second-order interpolation block that may be employed in place of the general interpolation block shown in FIG. 12, according to embodiments of the present invention.

FIG. 14 shows an embodiment of a second-order interpolation block 1400 that may be employed in place of the general interpolation block 1202 shown in FIG. 12. For clarity, different sections of the second-order interpolation block 1400 corresponding to the sections shown in FIG. 12 are shown enclosed by broken lines. Second-order interpolation block 1400 includes second-order interpolator section 1402, including hold register 1404, registers 1416 and 1418, incrementer (INC) 1408, scalar 1431, squarer 1428, multipliers 1420, 1422, divider 1424 and adder 1426. Second-order interpolation block 1400 further includes a selector section 1406 having NOR gates 1412, 1414, AND gate 1434, OR gate 1436 and MUX 1410. 1404, 1416 and 1418 may be, for example, D-type flip-flops or a RS flip-flops.

According to embodiments of the present invention, the selector section 1406 of second-order interpolation block 1400 receives as an input a CRC 512 from the packet deformatter 298 to determine whether to select second-order interpolation of audio samples or to select the output of the hold register 1404. As discussed above, CRC 512 is '1' when the corresponding audio data block 510 is in error and '0' when the audio data block 510 is free of errors.

According to embodiments of the present invention, all registers, latches, and the incrementer 1408 of second-order interpolation block 1400 are positive-edge triggered. The incrementer 1408 will count from 1 when a '1' is provided at the enable (E) of the incrementer 1408. If the reset (R) on incrementer 1408 goes to '1', the incrementer 1408 state resets to '0'. An output of incrementer 1408 is provided to multiplier 1420. The output of incrementer 1408 is also squared by squarer 1428 and provided to multiplier 1422. The output of multiplier 1420 is provided to adder 1426. The output of multiplier 1422 is provided to divider 1424, the output of which is then provided to adder 1426. The output of adder 1426 is provided to a first input of MUX 1410. According to embodiments of the present invention, it is required that the incrementer 1408 begins to count from 1 immediately after the CRC 512 input goes high. Incrementer 1408 generates the time index in terms of number of erroneous audio samples received. This, time index and the square of this time index is used to scale the first-order and second-order terms of the interpolator. The first-order and second-order terms are at the inputs of register 1416 and register 1418, respectively. The squarer 1428 is used to generate the square of the time index.

The hold register 1404 and registers 1416, 1418 allow a signal at their respective inputs to be received only when their respective enable line (E) is set to '1', else the outputs of the hold register 1404 and registers 1416, 1418 are held at their respective previous good value. Thus, according to embodiments of the present invention, when X='0', the hold register 1404 is enabled, its input is received and passed through to its output and is provided to an input of adder 1426 and also to a second input of MUX 1410. The two NOR gates 1412, 1414 generate enable signals to the registers 1416, 1418 depending on the CRC pattern (XYZ) over three audio data blocks.

More specifically, the two input NOR gate 1412 enables register 1416 whenever XY=00. When register 1416 is enabled, a combination of X and Y at the input of register 1416 is passed to the output of register 1416. Subtractor 1430 receives as inputs X and Y and provides the combination of X and Y at its output to the input of register 1416.

Similarly, the three input NOR gate 1418 enables the register 1418 whenever XYZ=000. When register 1418 is enabled, a combination of X, Y and Z at the input of register 1418 is passed to the output of register 1418. Subtractor 1432 receives as inputs X, Y (via scalar 1431) and Z and provides the combination of X, Y and Z at its output to the input of register 1418.

The output of adder 1426 is a total calculation of all error free audio data samples. In other words, only error free audio samples are allowed to reach the input of adder 1426. Thus, when all of the audio samples XYZ are error free (i.e., XYZ are all '0') all of hold registers 1404, 1416 and 1418 are enabled and pass to their respective outputs the present error free audio samples at their respective inputs. However, when any of the XYZ audio samples include errors (i.e., are '1') the respective registers will not be enabled to pass the audio sample including the error and it will thus not be considered in the total calculation by adder 1426. Instead, the previous good audio sample held in the respective register is present at the output of the respective register and is passed to a respective input of adder 1426.

The first input of MUX 1410 (i.e., the output of the adder 1426) is passed to the output of MUX 1410 and to the audio output (Audio OUT) of second-order interpolation block 1400 when the first input of MUX 1410 is selected by selector section 1406 using a select line (S) of MUX 1410. That is, XYZ equals one or more of '100', '101', and '110', the first input of MUX 1410 is selected by selector section 1406 to be passed to the output of MUX 1410 and to the audio output of second-order interpolation block 1400 using the select line of the MUX 1410.

The second input of MUX 1410 (i.e., the output of hold register 1404) is passed to the output of MUX 1410 and to the audio output (Audio OUT) of second-order interpolation block 1400 when the second input of MUX 1410 is selected by selector section 1406 using the select line of MUX 1410.

That is, when XYZ does not equal one or more of '100', '101', and '110', the second input of MUX 1410 is selected by selector section 1406 to be passed to the output of MUX 1410 and to the audio output of second-order interpolation block 1400 using the select line of the MUX 1410. The AND gate 1434 and the OR gate 1436 implements the selection process described above.

Thus, according to embodiments of the present invention, different portions of the second-order interpolation block 1400 are enabled depending on the XYZ patterns so that the interpolator estimation uses audio data not corrupted by errors. The data path should be kept at full precision internally but truncate to 20 bits at the inputs of the MUX 1410. According to other embodiments, the truncation could differ depending on the length of the audio data for the particular system being implemented.

Figure 15:
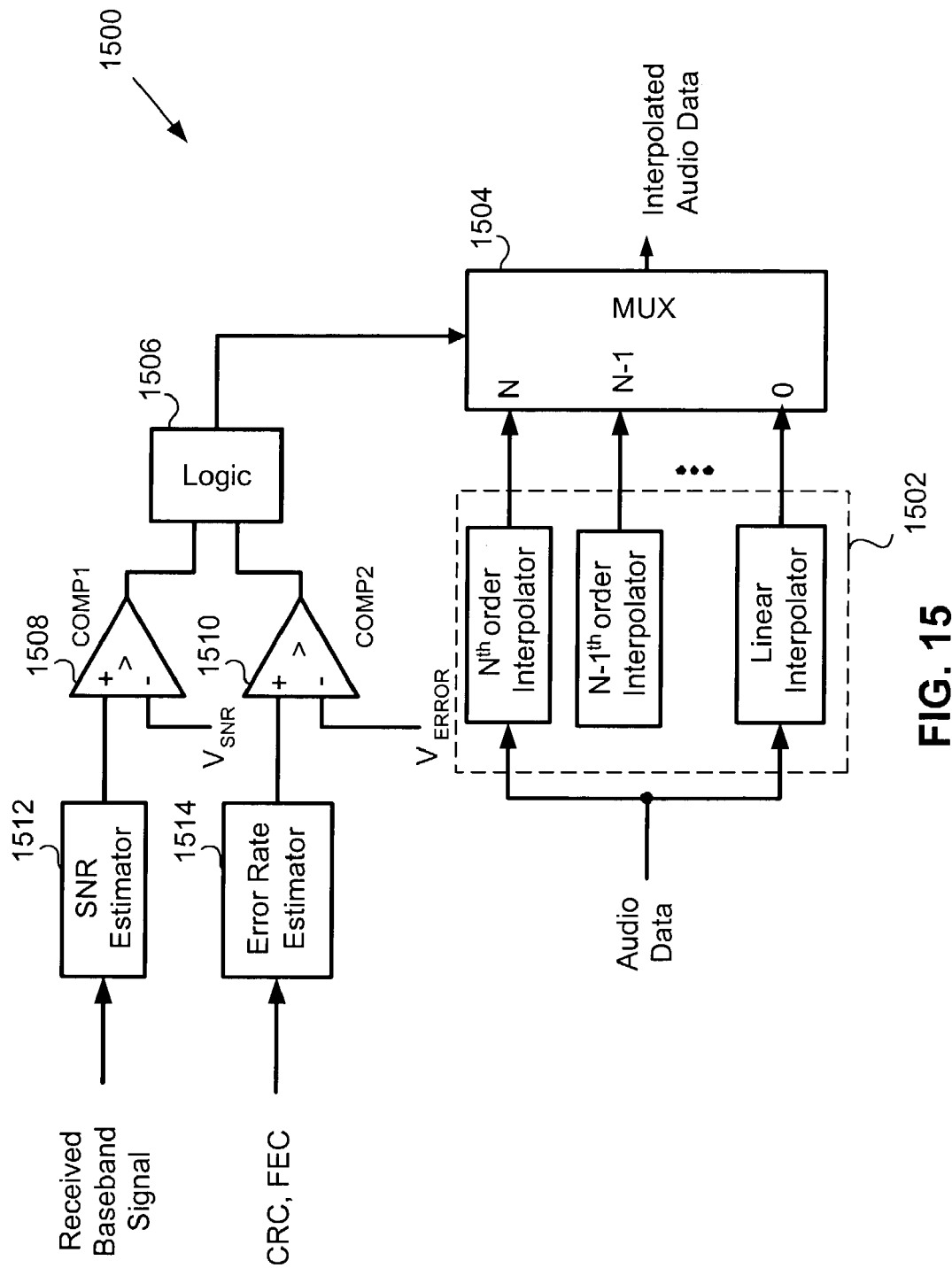
FIG. 15 shows an exemplary multiple-order interpolation block that may be employed in place of the general interpolation block shown in FIG. 12, according to embodiments of the present invention.

FIG. 15 shows an embodiment of a multiple-order interpolation block 1500 that may be employed in place of the general interpolation block 1202 shown in FIG. 12. The multiple-order interpolation block 1500 may include multiple interpolators 1502 (ranging from a linear interpolator ($1^{st}$ order) to an $N^{th}$-order interpolator) with a MUX 1504 to select between the interpolator outputs. The selection decision is made by the logic block 1506 which makes a decision based on the results of the comparators COMP1 1508 and COMP2 1510. COMP1 1508 compares the output of the signal-to-noise ratio (SNR) estimator block 1512 against a threshold $V_{SNR}$ and COMP2 1510 compares the output of the error rate estimator block 1514 against a threshold $V_{ERROR}$. The SNR estimator block 1512 estimates the received signal SNR based on the received baseband signal, typically requiring the soft-decision value before data demodulation. The error rate estimator block 1514 estimates the error rate in the received data.

According to embodiments of the present invention, for high SNR and low error rate conditions, a higher-order interpolator may be used while for low SNR and high error rate conditions, a lower order interpolator may be used. The selection of interpolation method may be determined upon initial start-up or may be selected during run-time in more advanced implementations based on SNR and/or error rate estimates computed in real time.

According to embodiments of the present invention, the error rate could be bit error rate, audio data block error rate, or packet error rate. The bit error rate can be estimated if forward error correction is used. The packet and block error rate can be computed based on the number of CRC errors occurring over N packets or audio data blocks.

Figure 16:
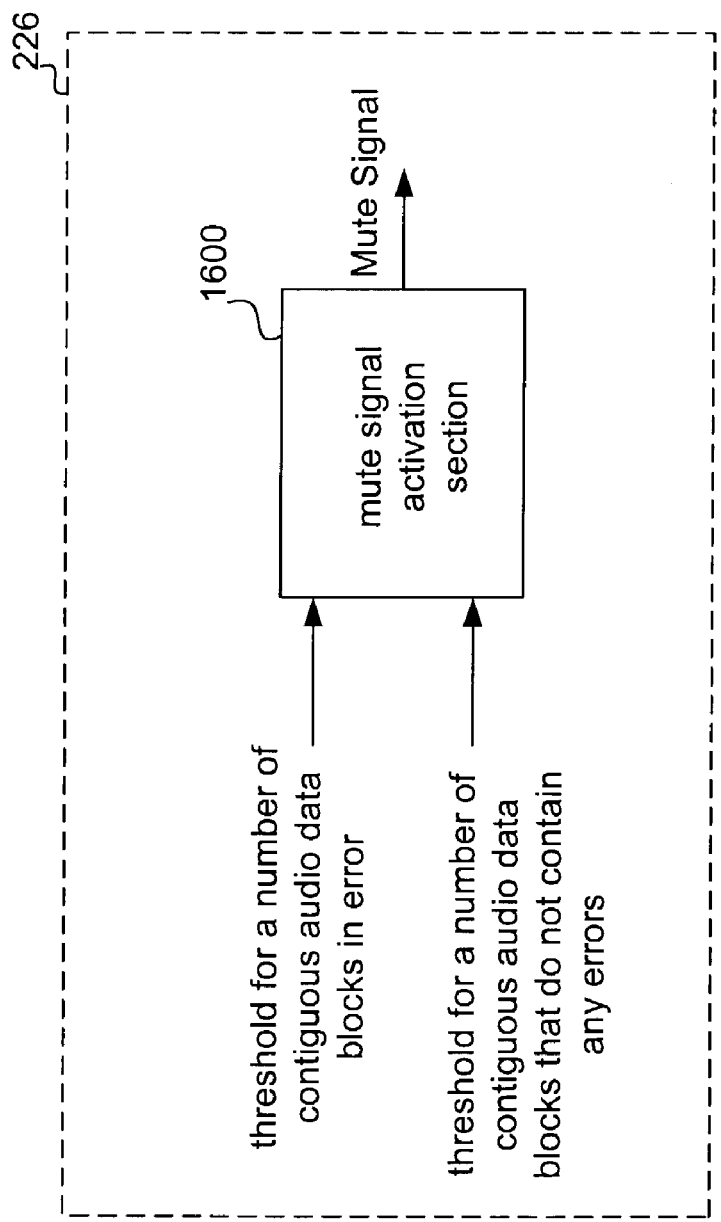
FIG. 16 shows a block diagram of an exemplary mute signal activation section that may be employed in the digital modem receiver shown in FIG. 8, according to embodiments of the present invention.

When a burst of errors occurs, the audio quality becomes degraded significantly. In such a situation, embodiments of the present invention provide a mute signal activation section 1600, as shown in FIG. 16. Mute signal activation section 1600 activates a mute signal so that the audio receiver 228 may mute the speaker 232 (FIG. 2).

Figure 17:
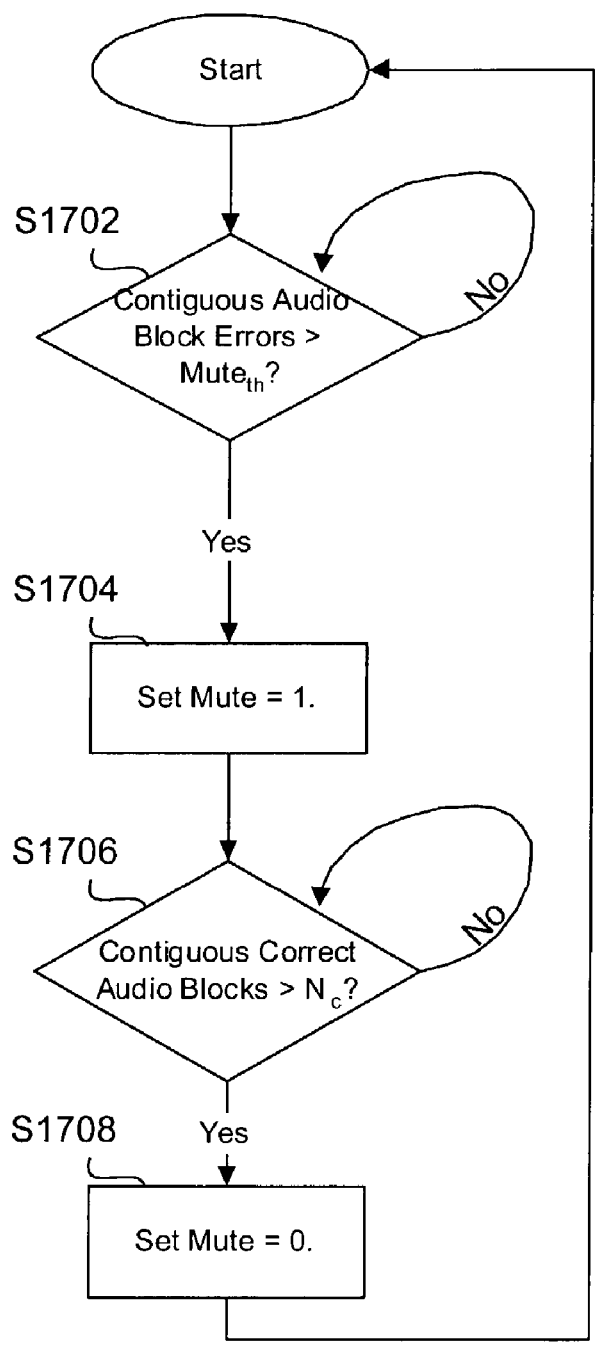
FIG. 17 shows a state diagram for controlling the state of an internal mute signal, according to embodiments of the present invention.

The state diagram that controls the state of an internal mute signal (Mute), according to embodiments of the present invention, is shown in FIG. 17. Mute$_{th}$ and $N_c$ are configurable parameters that may be set during initial configuration. Mute$_{th}$ represents a threshold number of contiguous audio data blocks having errors. $N_c$ represents a threshold number of contiguous audio data blocks that do not contain any errors.

As shown in FIG. 17, it is determined if a number of contiguous audio data block errors are greater than Mute$_{th}$ (S1702). If the number of contiguous audio data block errors are not greater than Mute$_{th}$ (No), then S1702 is repeated. On the other hand, if the number of contiguous audio data block errors is greater than Mute$_{th}$ (Yes), the mute signal is activated by the mute signal activation section 1600 (S1704).

It is then determined if a number of contiguous correct audio data blocks is greater than $N_c$ (S1706). If the number of contiguous correct audio data blocks is not greater than $N_c$ (No), S1706 is repeated. On the other hand, if the number of contiguous correct audio data blocks is greater than $N_c$ (Yes), the mute signal becomes inactive (S1708).

Figure 18:
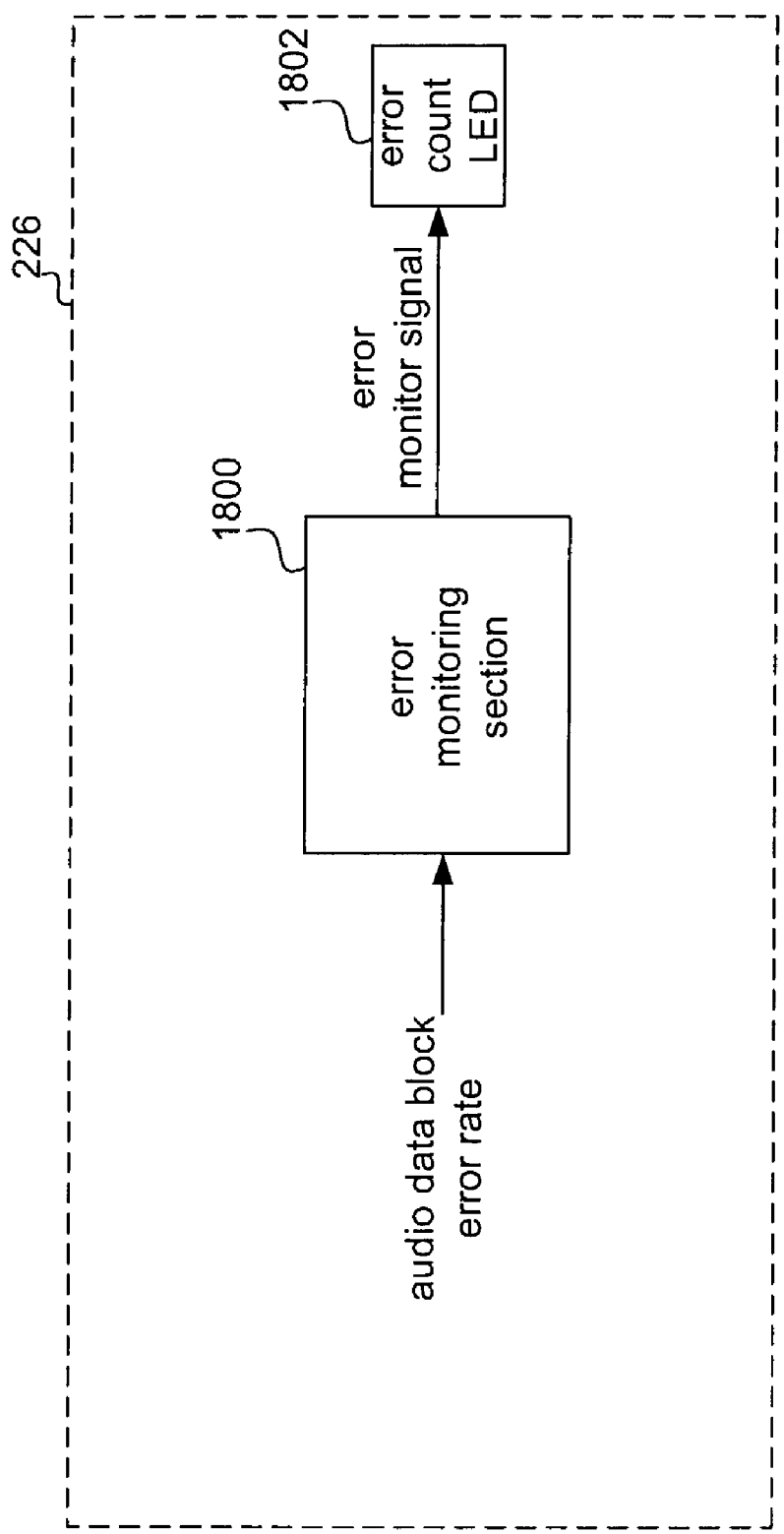
FIG. 18 shows a block diagram of an error monitoring section for monitoring a audio data block error rate, according to embodiments of the present invention.

According to embodiments of the present invention, for testing and diagnostic purposes, as shown in FIG. 18, an audio data block error rate is monitored over 64 audio data blocks by error monitoring section 1800. Audio data block error is determined when the CRC 512 fails (i.e. CRC=1). The number of CRCs failed over 64 audio data blocks is monitored to generate an error count. The error count may be used to determine the frequency of an error monitor signal.

Table 4 summarizes the mapping of the number of CRC 512 failures over 64 audio data blocks to the output frequency of the error count, which should be at logic low for the case of greater than 32 CRC failures (i.e. logic '0'). In other cases, the error monitor signal is a square wave with a frequency equal to one of those shown in Table 4. The error monitoring section 1800 implements the mapping shown in Table 4. An error count LED 1802 can drive an light emitting diode (LED) to give visual diagnostic on the link performance. Note that Table 4 represents one particular mapping of error to output frequency. Other suitable mapping may be implemented.

TABLE 4

(Output frequency mapping to number of CRC failures)

| Number of CRC failures | Output Frequency |
| --- | --- |
| 0 | 0 Hz (LED always off) |
| 1–6 | BCK/8192 |
| 6–16 | BCK/16384 |
| 16–32 | BCK/32768 |
| >32 | 0 Hz (LED always on) |

It is to be understood that even though numerous characteristics and advantages of various embodiments of the present invention have been set forth in the foregoing description, together with details of the structure and function of various embodiments of the invention, this disclosure is illustrative only. Changes may be made in detail, especially matters of structure and management of parts within the principles of the present invention to the full extent indicated by the broad general meaning of the terms in which the appended claims are expressed.

What is claimed is:

1. An apparatus for concealing errors in digital data, the apparatus having an input for receiving the digital data and an output for outputting the digital data after error concealment, the apparatus further comprising:

at least one interpolator for estimating a value of a sample of the received digital data from other samples of the received digital data, the other samples including samples besides a sample immediately previous to the sample of received digital data, the at least one interpolator having an input for inputting the received digital data and an output for outputting the estimated value of the sample of the received digital data;

at least one first holding unit having an input for selectively receiving the sample of the received digital data only when the sample is error free, and an output for outputting the error free sample of the received digital data; and a selector for selecting between outputting the estimated value of the sample of the received digital data and outputting the error free sample of the received digital data based on at least one error indicator.

2. The apparatus recited in claim 1, wherein the input of the at least one first holding unit is in parallel with the input of the at least one interpolator.

3. The apparatus recited in claim 1, wherein the estimated value of the sample of the received digital data or the error free sample of the received digital data is outputted to the output of the apparatus.

4. The apparatus recited in claim 1, wherein the at least one error indicator results from a cyclic redundancy check (CRC) performed on at least one sample of the received digital data.

5. The apparatus recited in claim 1, wherein the at least one error indicator comprises three enor indicators, the three error indicators resulting from a cyclic redundancy check (CRC) performed on three corresponding temporally adjacent samples of the received digital data.

6. The apparatus recited in claim 1, wherein the at least one interpolator comprises at least one first-order interpolator.

7. The apparatus recited in claim 6, wherein the at least one first-order interpolator comprises at least one left audio data first-order interpolator and at least one right audio data first-order interpolator.

8. The apparatus recited in claim 6, wherein the at least one first holding unit comprises at least one left audio data first holding unit and at least one right audio data first holding unit.

9. The apparatus recited in claim 6, wherein the selector comprises at least one left audio data multiplexer (MUX) and at least one right audio data multiplexer (MUX), each of the at least one left audio data multiplexer (MUX) and the at least one right audio data multiplexer (MUX) having a first input for receiving the outputted estimated value of the sample of the received digital data, a second input for receiving the outputted error free sample of the received digital data, and an output for outputting one of the estimated value of the sample of the received digital data and the error free sample of the received digital data based on the at least one error indicator.

10. The apparatus recited in claim 9, wherein each of the at least one left audio data multiplexer (MUX) and the at least one right audio data multiplexer (MUX) includes a select line;

wherein the at least one error indicator comprises a plurality of error indicators; and wherein the selector further comprises combinational logic having at least one input for receiving the plurality of error indicators and at least one output coupled to the select line of each of the at least one left audio data multiplexer (MUX) and the at least one right audio data multiplexer (MUX), the combinational logic generating a first logic level at the at least one output when the plurality of error indicators have a first pattern and a second logic level at the at least one output when the plurality of error indicators have a second pattern.

11. The apparatus recited in claim 10, wherein the plurality of error indicators comprises three error indicators corresponding respectively to three samples of the received digital data; and wherein the first pattern indicates that a first one of the three samples has an error while a second one and a third one of the three samples does not have an error, the second one and the third one of the three samples each being temporally adjacent to the first one of the three samples.

12. The apparatus recited in claim 10, wherein the first logic level selects the error free sample of the received digital data to be outputted at the output of the at least one left audio data multiplexer (MUX) and the at least one right audio data multiplexer (MUX), and the second pattern selects the estimated value of the sample of the received digital data to be outputted at the outputs of the at least one left audio data multiplexer (MUX) and the at least one right audio data multiplexer (MUX).

13. The apparatus recited in claim 1, wherein the at least one interpolator comprises at least one second-order interpolator.

14. The apparatus recited in claim 13, wherein the at least one error indicator comprises three error indicators corresponding respectively to three samples of the digital data;

wherein the at least one first holding unit selectively receives a first sample of the three samples only when the first sample is error free; and wherein the at least one second-order interpolator comprises:

at least one second holding unit including an input for selectively receiving a combination of a second sample and a third sample of the three samples only when the second sample and the third sample are both error free, and an output for outputting the error free combination of the second sample and the third sample; and at least one third holding unit including an input for selectively receiving a combination of the first sample, the second sample and the third sample of the three samples only when the first sample, the second sample and the third sample are all error free, and an output for outputting the error free combination of the first sample, the second sample and the third sample.

15. The apparatus recited in claim 14, wherein the interpolator further comprises an adder for summing the error free first sample, the error free combination of the second sample and the third sample, and the error free combination of the first sample, the second sample and the third sample to produce a summed output, the adder having inputs for receiving the error free first sample, the error free combination of the second sample and the third sample, and the error free combination of the first sample, the second sample and the third sample, and an output for outputting the summed output.

16. The apparatus recited in claim 14, wherein each of the at least one first holding unit, the at least one second holding unit and the at least one third holding unit each comprise an enable line; and wherein each of the error free first sample, the error free combination of the second sample and the third sample, and the error free combination of the first sample, the second sample and the third sample are received by respective ones of the at least one first holding unit, the at least one second holding unit and the at least one third holding unit only when the corresponding enable line is active.

17. The apparatus recited in claim 16, wherein the selector comprises at least one multiplexer (MUX) having a first input for receiving the error free first sample, a second input for receiving the summed output, and an output for outputting one of the error free first sample and the summed output based on at least one of the three error indicators.

18. The apparatus recited in claim 17, wherein the at least one multiplexer (MUX) includes a select line; and
wherein the selector further comprises at least one logic gate having at least one input for receiving at least one of the three error indicators and at least one output for controlling at least one of the select line of the at least one multiplexer (MUX) and the enable line of the at least one first holding unit, the at least one logic gate generating a first logic level at the at least one output when the at least one of the three error indicators has a first state and a second logic level at the at least one output when the at least one of the three error indicators has a second state.

19. The apparatus recited in claim 16, wherein the selector further comprises at least one logic gate having at least two inputs for receiving at least two of the three error indicators and at least one output coupled to the enable line of the at least one second holding unit, the at least one logic gate generating a first logic level at the at least one output when the at least two of the three error indicators have a first pattern and a second logic level at the at least one output when the at least two of the three error indicators have a second pattern.

20. The apparatus recited in claim 16, wherein the selector further comprises at least one logic gate having at least three inputs for receiving the three error indicators and at least one output coupled to the enable line of the at least one third holding unit, the at least one logic gate generating a first logic level at the at least one output when the three error indicators have a first pattern and a second logic level at the at least one output when the three error indicators have a second pattern.

21. The apparatus recited in claim 14, wherein each of the at least one first holding unit, the at least one second holding unit and the at least one third holding unit comprise at least one register.

22. The apparatus recited in claim 21, wherein the at least one register is at least one of a D-type flip-flop and an RS flip-flop.

23. The apparatus recited in claim 1, wherein the at least one interpolator comprises at least one third-order interpolator.

24. The apparatus recited in claim 1, wherein the at least one interpolator conipi-ises a multiple-order interpolator.

25. The apparatus recited in claim 24, wherein the multiple-order interpolator comprises multiple selectable interpolators.

26. The apparatus recited in claim 25, wherein the multiple selectable interpolators are selectable based on at least one of a signal-to-noise ratio (SNR) and an error rate.

27. The apparatus recited in claim 26, wherein the digital data is contained in a packet having at least one audio data block, and wherein the error rate is at least one of a bit error rate, an audio data block error rate, or a packet error rate.

28. The apparatus recited in claim 27, wherein the bit error rate is estimated.

29. The apparatus recited in claim 27, wherein the packet error rate and the block error rate are computed based on a number of error indicators occurring over at least one of a plurality of packets and a plurality of audio data blocks.

30. The apparatus recited in claim 25, wherein the multiple selectable interpolators are selectable based on a comparison of a signal-to-noise ratio (SNR) of a received baseband signal to a threshold signal-to-noise ratio (SNR).

31. The apparatus recited in claim 25, wherein the multiple selectable interpolators are selectable based on a comparison of an error rate in the received digital data to a threshold error rate.

32. The apparatus recited in claim 1, wherein the selector comprises at least one multiplexer (MUX) having a first input for receiving the outputted estimated value of the sample of the received digital data, a second input for receiving the outputted error free sample of the received digital data, and an output for outputting one of the estimated value of the sample of the received digital data and the error free sample of the received digital data based on the at least one error indicator.

33. The apparatus recited in claim 1, wherein the at least one interpolator comprises at least one additional holding unit and wherein the selector selectively enables the at least one additional holding unit.

34. The apparatus recited in claim 1, wherein the digital data is audio data.

35. The apparatus recited in claim 1, wherein the digital data is formatted as a packet.

36. The apparatus recited in claim 35, wherein the packet comprises an error correction code.

37. The apparatus recited in claim 35, wherein the packet comprises:
a preamble;
a three bit SOF field;
an eight bit header field with an eight bit cyclic redundancy check (CRC); and
at least one audio data block, the at least one audio data block having an eight bit cyclic redundancy check (CRC).

38. The apparatus recited in claim 37, wherein the at least one audio data block comprises an Audio Data (Right) channel and an Audio Data (Left) channel.

39. The apparatus recited in claim 38, wherein each of the Audio Data (Right) channel and the Audio Data (Left) channel has 20 bits.

40. The apparatus recited in claim 37, wherein the packet further comprises an eight bit command field with an eight bit cyclic redundancy check (CRC).

41. The apparatus recited in claim 37, wherein the at least one audio data block comprises 40 bits.

42. The apparatus recited in claim 37, wherein the at least one audio data block comprises a plurality of audio data blocks, and wherein the header field specifies how many audio data blocks are in the plurality of audio data blocks.

43. The apparatus recited in claim 37, wherein the plurality of audio data blocks are interleaved.

44. The apparatus recited in claim 1, wherein the at least one first holding unit includes an enable line, and wherein the sample of the received digital data is received only when the enable line is active.

45. The apparatus recited in claim 1, wherein the at least one first holding unit comprises at least one register.

46. The apparatus recited in claim 45, wherein the at least one register is at least one of a D-type flip-flop and a RS flip-flop.

47. The apparatus recited in claim 45, wherein the at least one register is clocked by a clock at a multiple of at least one of 44.1 KHz and 48 KHz.

48. A receiver for receiving a signal including digital data in the form of packets transmitted from a transmitter, and for concealing errors in the digital data, the receiver comprising:
an interpolator section including:
at least one interpolator for estimating a value of a sample of received digital data from other samples of the received digital data, the other samples including samples besides a sample immediately previous to the sample of received digital data, the at least one interpolator having an input for inputting the received digital data and an output for outputting the estimated value of the sample of the received digital data;

at least one holding unit having an input for selectively receiving the sample of the received digital data only when the sample is error free and an output for outputting the error free sample of the received digital data; and a selector for selecting between outputting the estimated value of the sample of the received digital data and outputting the error free sample of the received digital data based on at least one error indicator.

49. The receiver recited in claim 48, wherein the at least one interpolator comprises at least one additional holding unit and wherein the selector selectively enables the at least one additional holding unit.

50. The receiver recited in claim 48, wherein the input of the at least one holding unit is in parallel with the input of the at least one interpolator.

51. The receiver recited in claim 48, wherein the estimated value of the sample of the received digital data or the error free sample of the received digital data is outputted to an output of the interpolator section.

52. The receiver recited in claim 48, further comprising:

a radio frequency (RF) receiver section for receiving the transmitted digital data as in-phase (I) and quadrature (Q) components of a baseband signal;

a sampling device coupled to the radio frequency (RF) receiver for digitizing each of the in-phase (1) and quadrature (Q) components; and a demodulator coupled to the sampling device for recovering transmitted symbols.

53. The receiver recited in claim 52, wherein the demodulator is a non-coherent demodulator.

54. The receiver recited in claim 53, wherein the non-coherent demodulator comprises differential detectors for multiplying the in-phase (I) and quadrature (Q) components of the baseband signal by a delayed version of the in-phase (I) and quadrature (Q) components of the baseband signal.

55. The receiver recited in claim 54, wherein the delayed version of the in-phase (I) and quadrature (Q) components of the baseband signal has a delay equal to a period of a symbol clock for clocking the sampling device at the symbol rate.

56. The receiver recited in claim 54, wherein the non-coherent demodulator further comprises:

an adder having inputs for receiving outputs of the differential detectors, the adder for adding the received outputs of the differential detectors and for generating a soft decision value at an output of the adder; and a slicer having an input for receiving the soft decision value and for generating a demodulated symbol based on the soft decision value at an output of the slicer.

57. The receiver recited in claim 53, wherein the non-coherent demodulator demodulates differentially encoded binary phase shift key (BPSK) signals.

58. The receiver recited in claim 52, further comprising a forward error correction (FEC) decoder coupled to the demodulator for recovering originally transmitted data from the recovered transmitted symbols.

59. The receiver recited in claim 58, further comprising a packet deformatter for deformatting the packets, the packet deformatter having an input coupled to the forward error correction (FEC) decoder and an output coupled to the interpolator section.

60. The receiver recited in claim 59, further comprising an audio interface section for processing the digital data, the audio interface section having an input coupled to the interpolator section and an output for outputting the digital data in a standard format.

61. The receiver recited in claim 60, wherein the digital data is audio digital data, and wherein the standard format is an I2S format.

62. The receiver recited in claim 60, wherein the digital data is audio digital data, and wherein the standard format is a Sony Phillips Digital Interface (SPDIF) form at.

63. The receiver recited in claim 59, wherein the packets transmitted from the transmitter include a plurality of audio data blocks;

wherein the transmitter includes an audio data block interleaver for interleaving an original sequence of the plurality of audio data blocks; and wherein the packet deformatter comprises an audio data block de-interleaver for reverting the interleaved plurality of audio data blocks to the original sequence.

64. The receiver recited in claim 63, wherein the audio data block interleaver comprises:

a buffer for buffering the audio data blocks; and an interleaver sequencer for interleaving the buffered audio data blocks.

65. The receiver recited in claim 63, wherein the audio data block de-interleaver comprises:

a buffer for buffering the interleaved audio data blocks; and a de-interleaver sequencer for de-interleaving the interleaved audio data blocks.

66. The receiver recited in claim 65, wherein the audio data block de-interleaver further comprises a parser for parsing the audio data blocks into data corresponding to a plurality of audio channels.

67. The receiver recited in claim 59, wherein the packet deformatter detects a dropped packet and sends an error indicator corresponding to a sample of the received digital data contained in the dropped packet to the interpolation section.

68. The receiver recited in claim 48, wherein the digital data is audio digital data, and wherein the audio digital data is sampled at an audio sampling rate of 44.1 KHz or 48 KHz.

69. The receiver recited in claim 48, wherein the packets transmitted from the transmitter comprise an error correction code.

70. The receiver recited in claim 48, wherein the packets transmitted from the transmitter comprise:

a preamble;

a three bit SOF field;

an eight bit header field with an eight bit cyclic redundancy cheek (CRC); and at least one audio data block, the at least one audio data block having an eight bit cyclic redundancy check (CRC).

71. The receiver recited in claim 70, wherein the at least one audio data block comprises a plurality of audio data blocks, and wherein the plurality of audio data blocks are interleaved.

72. The receiver recited in claim 48, wherein the receiver further comprises a mute signal activation section for activating a mute signal.

73. The receiver recited in claim 72, wherein the packets comprise at least one audio data block; and wherein the mute signal is activated based on a threshold number of contiguous audio data blocks having errors and a threshold number of contiguous audio data blocks that do not contain any errors.

74. The receiver recited in claim 73, wherein the mute signal activation section activates the mute signal when a number of contiguous audio data block errors is greater than the threshold number of contiguous audio data blocks having errors.

75. The receiver recited in claim 74, wherein the mute signal activation section:
 determines if a number of contiguous audio data blocks that do not contain any errors is greater than the threshold number of contiguous audio data blocks that do not contain any errors; and
 deactivates the mute signal when the number of contiguous audio data blocks that do not contain any errors is greater than the threshold number of contiguous audio data blocks that do not contain any errors.

76. The receiver recited in claim 48, further comprising an error monitoring section for monitoring a audio data block error rate.

77. The receiver recited in claim 76, wherein a audio data block error is determined when the error indicator indicates an error.

78. The receiver recited in claim 76, wherein the error monitoring section determines a number of audio data block errors occurring over 64 audio data blocks and generates an error count corresponding to the determined number of audio data block errors.

79. The receiver recited in claim 78, wherein the error monitoring section generates an error monitor signal having a frequency based on the generated error count.

80. The receiver recited in claim 79, wherein the error monitor signal is a square wave.

81. The receiver recited in claim 78, wherein the error monitor signal drives a visual indicator.

82. The receiver recited in claim 81, wherein the visual indicator is a light emitting diode (LED).

83. The receiver recited in claim 48, wherein the signal including digital data in the form of packets is transmitted from the transmitter to the receiver on a carrier frequency within a shared band of frequencies, the shared band having designated channels with designated bandwidths, a first designated bandwidth of a first channel ending at a first predetermined frequency within the shared band and a second designated bandwidth of a second channel beginning at a second predetermined frequency within the shared band, the carrier frequency being centered between the first predetermined frequency and the second predetermined frequency.

84. The receiver recited in claim 83, wherein the first predetermined frequency and the second predetermined frequency are the same frequency.

85. The receiver recited in claim 83, wherein the designated bandwidths of the designated channels begin and end at respective 10 dB down points of the designated bandwidths.

86. The receiver recited in claim 83, wherein the shared band is the Industrial Scientific Medical (ISM) band.

87. The receiver recited in claim 83, wherein the carrier frequency is selected from the group consisting of 5.165 Giga Hertz (GHz), 5.19 GHz, 5.21 GHz, 5.23 GHz, 5.25 GHz, 5.27 GHz, 5.29 GHz, 5.31 GHz, 5.335 GHz, 5.735 GHz, 5.755 GHz, 5.775 GHz, 5.795 GHz, 5.815 GHz, 2.427 GHz, 2.4245 GHz or 2.425 GHz, 2.457 GHz, 2.4495 GHz or 2.450 GHz, and 2.47275 GHz or 2.473 GHz.

88. A communication system comprising:
 a transmitter for transmitting digital data; and
 a receiver for receiving the transmitted digital data, the receiver including:
 at least one interpolator for estimating a value of a sample of received digital data from other samples of the received digital data, the other samples including samples besides a sample immediately previous to the sample of received digital data, the at least one interpolator having an input for inputting the received digital data and an output for outputting the estimated value of the sample of the received digital data;
 at least one holding unit having an input for selectively receiving the sample of the received digital data only when the sample is error free, and an output for outputting the error free sample of the received digital data; and
 a selector for selecting between outputting the estimated value of the sample of the received digital data and outputting the error free sample of the received digital data based on at least one error indicator.

89. The communication system recited in claim 88, wherein the input of the at least one holding unit is in parallel with the input of the at least one interpolator.

90. A method for concealing errors in digital data, the method comprising:
 providing at least one interpolator for estimating a value of a sample of digital data from other samples of the digital data, the other samples including samples besides a sample immediately previous to the sample of received digital data, the at least one interpolator having an input for inputting the digital data and an output for outputting the estimated value of the sample of the digital data;
 providing at least one holding unit having an input for selectively receiving the sample of the digital data only when the sample is error free and an output for outputting the error free sample of the digital data; and
 providing a selector for selecting between outputting the estimated value of the sample of the digital data and outputting the error free sample of the digital data based on at least one error indicator.

91. The method recited in claim 90, wherein the input of the at least one holding unit is in parallel with the input of the at least one interpolator.

92. The method recited in claim 90, wherein the at least one error indicator results from a cyclic redundancy check (CRC) performed on at least one sample of the received digital data.

93. The method recited in claim 90, wherein the at least one error indicator comprises three error indicators, the three error indicators resulting from a cyclic redundancy check (CRC) performed on three corresponding temporally adjacent samples of the digital data.

94. The method recited in claim 90, wherein the digital data is audio data.

95. The method recited in claim 90, wherein the digital data is formatted as a packet.

* * * * *